United States Patent
Takahashi et al.

(10) Patent No.: US 11,222,914 B2
(45) Date of Patent: *Jan. 11, 2022

(54) SEMICONDUCTOR APPARATUS, METHOD OF MANUFACTURING SEMICONDUCTOR APPARATUS, METHOD OF DESIGNING SEMICONDUCTOR APPARATUS, AND ELECTRONIC APPARATUS

(71) Applicant: SONY CORPORATION, Tokyo (JP)

(72) Inventors: Hiroshi Takahashi, Kanagawa (JP); Shunichi Sukegawa, Kanagawa (JP); Keishi Inoue, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/572,442

(22) Filed: Sep. 16, 2019

(65) Prior Publication Data

US 2020/0013818 A1    Jan. 9, 2020

Related U.S. Application Data

(63) Continuation of application No. 15/875,259, filed on Jan. 19, 2018, now Pat. No. 10,453,886, which is a
(Continued)

(51) Int. Cl.
*H01L 27/148*  (2006.01)
*H01L 27/146*  (2006.01)
(Continued)

(52) U.S. Cl.
CPC .. *H01L 27/14634* (2013.01); *H01L 21/76802* (2013.01); *H01L 21/76898* (2013.01);
(Continued)

(58) Field of Classification Search
CPC ............... H01L 21/8221; H01L 25/043; H01L 25/0756; H01L 27/14806; H01L 27/14802
See application file for complete search history.

(56) References Cited

U.S. PATENT DOCUMENTS 8,541,878 B2 *   9/2013   Takahashi ......... H01L 27/14627
                                                          257/760
2005/0035381 A1    2/2005   Holm et al.
(Continued)

FOREIGN PATENT DOCUMENTS

JP    2002-289623    10/2002
JP    2006-049361     2/2006
(Continued)

OTHER PUBLICATIONS

Official Action (no English translation available) for Japanese Patent Application No. 2017-235039, dated Jan. 21, 2020, 5 pages.
(Continued)

*Primary Examiner* — Jae Lee
(74) *Attorney, Agent, or Firm* — Sheridan Ross P.C.

(57) ABSTRACT

A semiconductor device including a first material layer adjacent to a second material layer, a first via passing through the first material layer and extending into the second material layer, and a second via extending into the first material layer, where along a common cross section parallel to an interface between the two material layers, the first via has a cross section larger than that of the second via.

13 Claims, 33 Drawing Sheets

Related U.S. Application Data continuation of application No. 15/335,320, filed on Oct. 26, 2016, now Pat. No. 9,905,602, which is a continuation of application No. 14/995,072, filed on Jan. 13, 2016, now Pat. No. 9,508,772, which is a continuation of application No. 14/587,800, filed on Dec. 31, 2014, now Pat. No. 9,276,033, which is a continuation of application No. 13/962,711, filed on Aug. 8, 2013, now Pat. No. 8,946,898, which is a continuation of application No. 13/050,338, filed on Mar. 17, 2011, now Pat. No. 8,541,878.

(51) Int. Cl.
*H01L 21/768* (2006.01)
*H01L 23/48* (2006.01)
*H04N 5/369* (2011.01)
*H01L 31/02* (2006.01)
*H01L 23/535* (2006.01)
*H01L 23/528* (2006.01)
*H01L 23/00* (2006.01)

(52) U.S. Cl.
CPC ........ *H01L 23/481* (2013.01); *H01L 27/1464* (2013.01); *H01L 27/1469* (2013.01); *H01L 27/14621* (2013.01); *H01L 27/14627* (2013.01); *H01L 27/14632* (2013.01); *H01L 27/14636* (2013.01); *H01L 27/14638* (2013.01); *H01L 27/14645* (2013.01); *H01L 31/02002* (2013.01); *H04N 5/379* (2018.08); H01L 23/5283 (2013.01); H01L 23/535 (2013.01); H01L 24/05 (2013.01); H01L 31/02008 (2013.01); H01L 31/02013 (2013.01); H01L 2224/02166 (2013.01); H01L 2224/04042 (2013.01); H01L 2224/08145 (2013.01); H01L 2224/24147 (2013.01); H01L 2224/48463 (2013.01); H01L 2224/80896 (2013.01); H01L 2224/9202 (2013.01); H01L 2224/9212 (2013.01); H01L 2924/12043 (2013.01); H01L 2924/1306 (2013.01); H01L 2924/13091 (2013.01); H01L 2924/14 (2013.01); H01L 2924/3025 (2013.01)

(56) References Cited

U.S. PATENT DOCUMENTS

| | | |
|---|---|---|
| 2009/0275165 A1 | 11/2009 | Pourquier |
| 2009/0294814 A1 | 12/2009 | Assefa et al. |
| 2010/0178018 A1* | 7/2010 | Augusto ........... H01L 27/14685 385/131 |

FOREIGN PATENT DOCUMENTS

| | | |
|---|---|---|
| JP | 2006-093687 | 4/2006 |
| JP | 2008-048313 | 2/2008 |
| JP | 2008-235478 | 10/2008 |
| JP | 2009-124087 | 6/2009 |
| JP | 2009-181976 | 8/2009 |
| JP | 2009-277732 | 11/2009 |
| JP | 2009-283482 | 12/2009 |
| JP | 2019-506404 | 2/2010 |

OTHER PUBLICATIONS

Supplemental Official Action (no English translation available) for Japanese Patent Application No. 2017-235039, dated Jan. 21, 2020, 2 pages.
Official Action (no English translation available) for Japanese Patent Application No. 2017-235039, dated Jun. 25, 2019, 9 pages.
Official Action (no English translation available) for Japan Patent Application No. 2020-072253, dated Jun. 15, 2021, 4 pages.

* cited by examiner

151

21

27

81a

81a

81a

81a

81a

81a

81a

81a

81a

140a

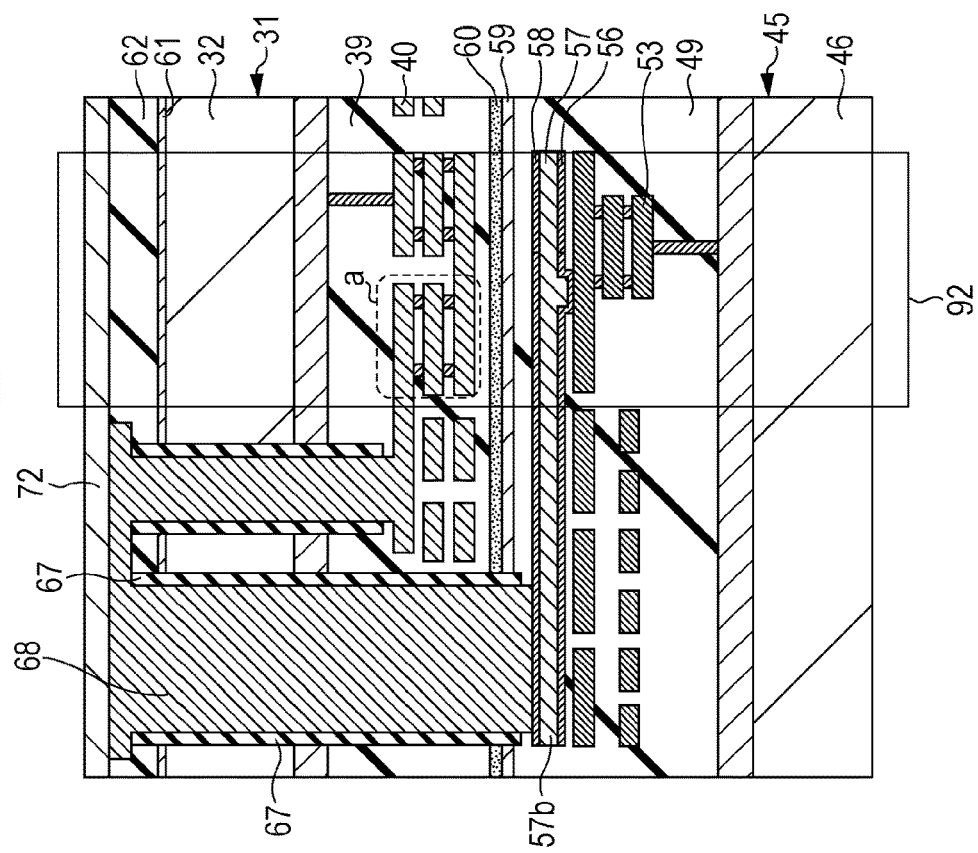
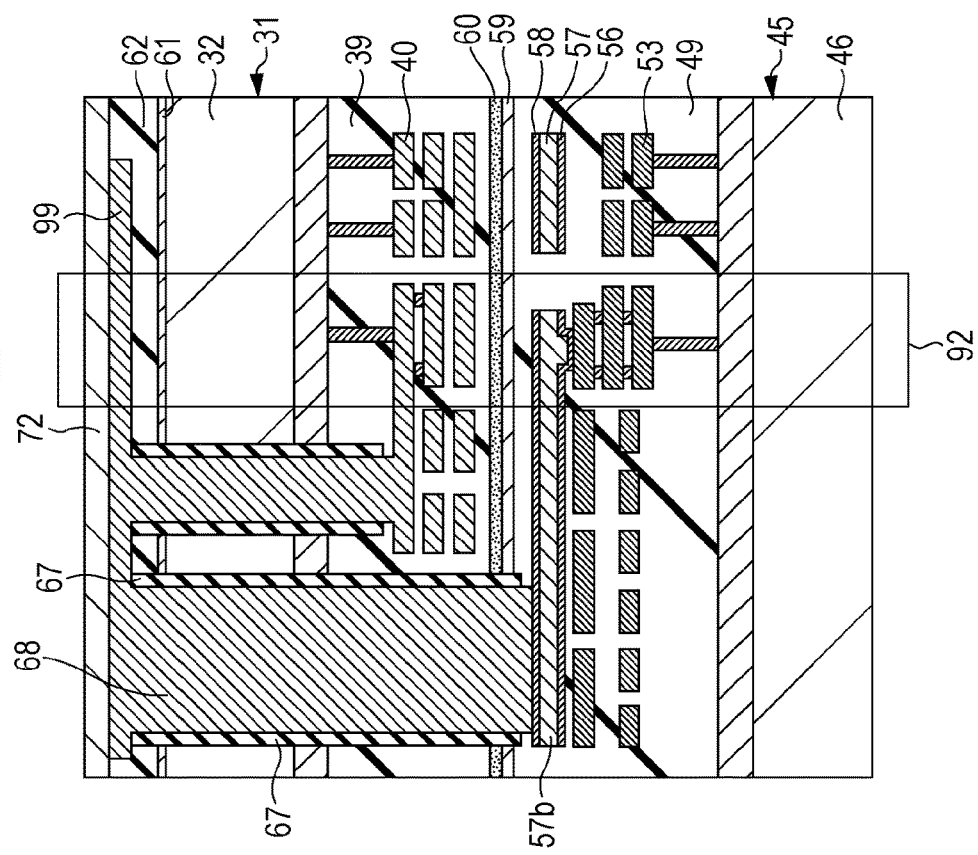

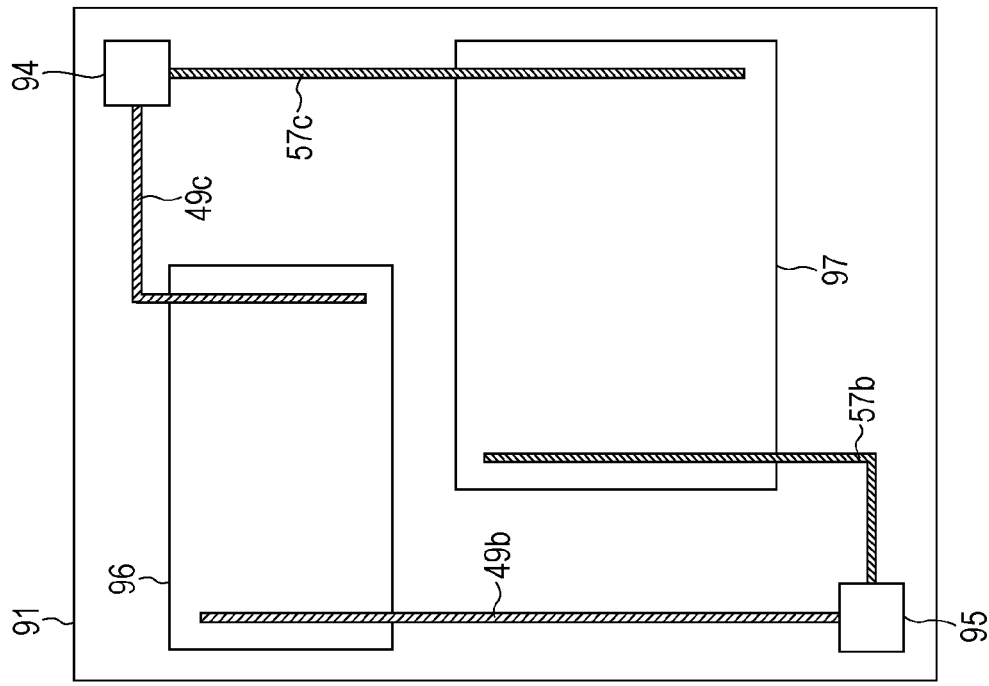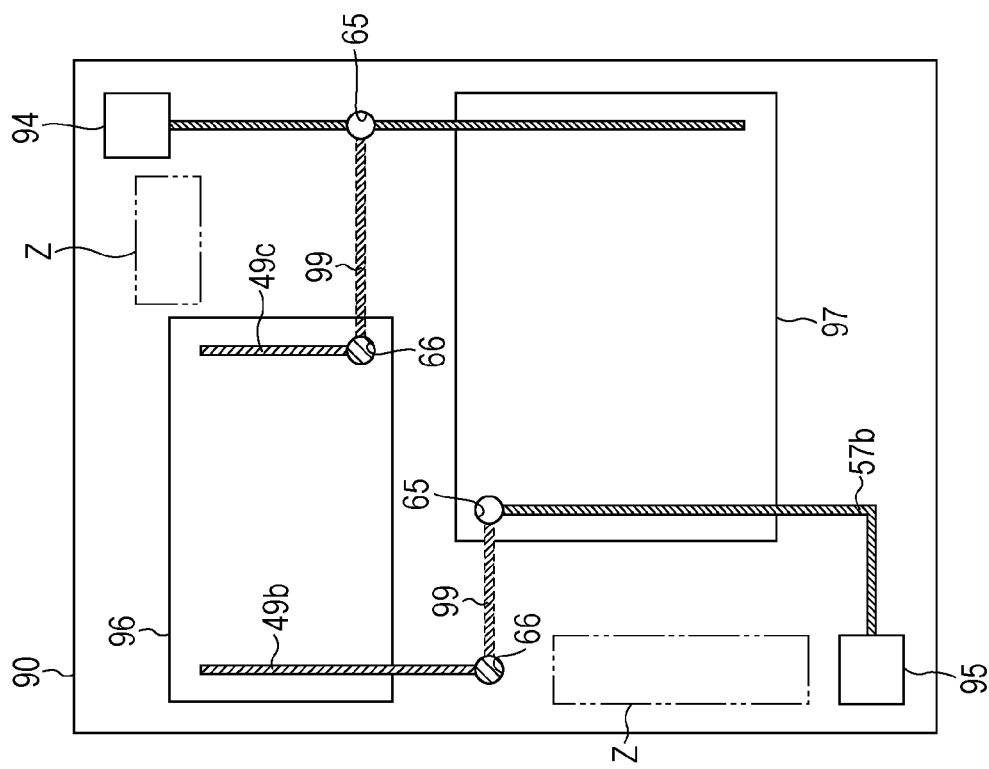

⊘ CONNECTION HOLE OF UPPER CHIP 66
○ VIA-CONNECTION HOLE OF LOWER CHIP 65

SEMICONDUCTOR APPARATUS, METHOD OF MANUFACTURING SEMICONDUCTOR APPARATUS, METHOD OF DESIGNING SEMICONDUCTOR APPARATUS, AND ELECTRONIC APPARATUS

CROSS-REFERENCE TO RELATED APPLICATIONS

This application is a continuation of U.S. patent application Ser. No. 15/875,259, filed Jan. 19, 2018, which is a continuation of U.S. patent application Ser. No. 15/335,320, filed Oct. 26, 2016, now U.S. Pat. No. 9,905,602, which is a continuation of U.S. patent application Ser. No. 14/995,072, filed Jan. 13, 2016, now U.S. Pat. No. 9,508,772, which is a continuation of U.S. patent application Ser. No. 14/587,800, filed Dec. 31, 2014, now U.S. Pat. No. 9,276,033, which is a continuation of U.S. patent application Ser. No. 13/962,711, filed Aug. 8, 2013, now U.S. Pat. No. 8,946,898, which is a continuation of U.S. patent application Ser. No. 13/050,338 filed Mar. 17, 2011, now U.S. Pat. No. 8,541,878, which claims the benefit of Japanese Patent Application No. 2010-070925, filed in the Japan Patent Office on Mar. 25, 2010, the entire contents of which are hereby incorporated by reference.

BACKGROUND OF THE INVENTION

The present invention relates to a semiconductor apparatus such as a solid-state imaging apparatus, a method of manufacturing the same, a method of designing the same, and an electronic apparatus such as a camera having the solid-state imaging apparatus.

An amplification type solid-state imaging apparatus representatively including a MOS type image sensor such as complementary metal oxide semiconductor (CMOS) is known in the art as a solid-state imaging apparatus. A charge transmission type solid-state imaging apparatus representatively including a charge coupled device (CCD) image sensor is also known in the art. Such solid-state imaging apparatuses are widely used in a digital still camera, a digital video camera, or the like. Recently, as a solid-state imaging apparatus mounted in a mobile device such as a camera-equipped mobile phone or a personal digital assistant (PDA), the MOS type image sensor is widely used when taking a low power voltage, low power consumption, or the like into account.

The MOS type solid-state imaging apparatus includes a pixel array obtained by arranging a plurality of unit pixels in a 2-dimensional array (pixel area) and a peripheral circuit area, in which the unit pixel includes a photodiode functioning as a photoelectric conversion portion and a plurality of pixel transistors. A plurality of pixel transistors are formed from a MOS transistor, and a three-transistor structure including a transmission transistor, a reset transistor, and an amplification transistor, or a four-transistor structure additionally including a selection transistor are used.

In the related art, as one of the MOS type solid-state imaging apparatuses, various solid-state imaging apparatuses were proposed, in which a semiconductor chip including the pixel area where a plurality of pixels are arranged and a semiconductor chip including a logic circuit for performing signal processing are electrically connected and integrated as a single device. For example, Japanese Unexamined Patent Application Publication No. 2006-49361 discloses a semiconductor module in which a rear-surface illuminated type image sensor chip having a micropad in each pixel cell is connected to a signal processing chip having a signal processing circuit and a micropad using a microbump.

Japanese Unexamined Patent Application Publication No. 2007-13089 discloses a device obtained by mounting, on the interposer (intermediate substrate), a sensor chip as a rear-surface illuminated type MOS solid-state imaging element where an imaging pixel portion is provided and a signal processing chip including peripheral circuits for signal processing. In Japanese Unexamined Patent Application Publication No. 2008-130603, a configuration having an image sensor chip, a thin circuit substrate, and a logic circuit chip for signal processing are disclosed. In addition, the thin circuit substrate and the logic circuit chip are electrically connected to each other, and the thin circuit substrate is electrically connected from the rear surface of the image sensor chip through a through-hole via.

Japanese Patent Publication No. 4000507 discloses a solid-state imaging apparatus in which a through electrode is provided in the solid-state imaging element supported by a transparent substrate, and the solid-state imaging element is electrically connected to the flexible circuit substrate through the through electrode. In addition, Japanese Unexamined Patent Application Publication No. 2003-31785 discloses a rear-surface illuminated type solid-state imaging apparatus in which an electrode passing through the support substrate is provided.

As disclosed in Japanese Unexamined Patent Application Publication Nos. 2006-49361, 2007-13089, and 2008-130603, various techniques for integrating the image sensor chip with other kinds of circuit chips such as logic circuit have been proposed. In the related art, nearly completed functional chips are integrated into a single chip by forming a through-connection hole and vertically stacking chips while they can be connected to each other.

As recognized even in the aforementioned solid-state imaging apparatuses of the related art, constructing a semiconductor device by connecting together different kinds of stacked chips by way of a connection conductor passing through the substrate is known. However, since it is necessary to open the connection hole while insulation is secured in the deep or lower substrate, those techniques are impractical because they are not cost efficient in terms of the manufacturing process necessary for the processing of the connection hole and the bury the connection conductor.

Meanwhile, for example, it is necessary to perform thinning of the upper chip up to the limit in order to form a small contact hole of about 1 μm. In this case, the manufacturing process becomes complicated, and cost increases due to problems such as the necessity to attach an upper chip to the support substrate before the thinning. Furthermore, in order to bury the connection conductor in the connection hole having a high aspect ratio, it is necessary to use a CVD film having a high coatability such as tungsten (W) as the connection conductor so that a material of the connection conductor is limited.

In order to provide economic efficiency that can be conveniently applied to mass production, the inventors view it desirable to significantly reduce an aspect ratio of the connection hole to make it easy to manufacture and provide a technique of fabricating the connection hole using a wafer manufacturing process of the related art without using a special connection hole fabrication. In this case, depths are different between a contact hole connected to the upper chip and a contact hole passing through the upper chip and reaching the lower chip. However, it is preferable to perform formation through the same etching process or the same metal burying process if possible.

In addition, in the solid-state imaging apparatus or the like, it is desired to achieve high performance by forming the image area and the logic circuit for signal processing to exhibit sufficient performance.

Even in semiconductor apparatuses having other semiconductor integrated circuits without being limited to the solid-state imaging apparatus, it is desirable to achieve high performance by forming each semiconductor integrated circuit to exhibit sufficient performance.

On the other hand, if design is carried out such that necessary functions are separately included in each of the upper and lower chips, since the circuit areas of portions having common functions are overlapped, the chip size increases, and it is difficult to reduce costs. Therefore, in order to at least reduce cost, one might design the areas of portions having the same function between upper and lower chips to be commonly used to the maximum.

SUMMARY

The present invention has been made to address the aforementioned problems, and it is desirable to provide a semiconductor apparatus such as a solid-state imaging apparatus and a method of manufacturing the same, by which it is possible to achieve high performance by allowing performance of each of the stacked semiconductor wafers to be sufficiently exhibited, and it is possible to improve productivity and reduce cost. In addition, it is desirable that the present invention provides an electronic apparatus such as a camera having the aforementioned solid-state imaging apparatus.

One embodiment consistent with the present invention includes a semiconductor device comprising a first material layer adjacent to a second material layer, a first via passing through the first material layer and extending into the second material layer, and a second via extending into the first material layer, where along a common cross section parallel to an interface between the two material layers, the first via has a cross section larger than that of the second via.

In another embodiment that is consistent with the present invention, the semiconductor device includes a first insulating layer in the first material layer, a second insulating layer in the second material layer, where the first via extends into the second insulating layer in the second material layer, and the second via extends into the first insulating layer in the first material layer.

In another embodiment that is consistent with the present invention, the first via and the second via are filled with a conductive material.

In another embodiment that is consistent with the present invention, the first via reaches a second interconnect in the second insulating layer in the second material layer.

In another embodiment that is consistent with the present invention, the second via reaches a first interconnect in the first insulating layer in the first material layer.

In another embodiment that is consistent with the present invention, the semiconductor device includes an on chip lens over the photodiode of the first material layer.

In another embodiment that is consistent with the present invention, the semiconductor device includes an on chip color filter between the photodiode and the on chip lens.

In another embodiment that is consistent with the present invention, the first via has a diameter 1.5 to 10 times a diameter of the second via along a common cross section parallel to an interface between the two material layers.

In another embodiment that is consistent with the present invention, the first via has a diameter 3 to 4 times a diameter of the second via along a common cross section parallel to an interface between the two material layers.

In another embodiment that is consistent with the present invention, the device is a backside illuminated device.

In another embodiment that is consistent with the present invention, the first material layer is a semiconductor layer.

In another embodiment that is consistent with the present invention, the second material layer is a semiconductor layer.

In another embodiment that is consistent with the present invention, the first material layer and the second material layer are separate layers.

Another embodiment consistent with the present invention includes a method of manufacturing a semiconductor device including the steps of forming a first material layer with a first surface and a second surface, forming a second material layer with a first surface and a second surface, securing the second surface of the first material layer against the first surface of the second material layer, and forming a first via and a second via simultaneously, where along a common cross section parallel to an interface between the two material layers, the first via has a cross section larger than that of the second via.

In another embodiment that is consistent with the present invention, the method includes the steps of forming a first insulating layer in the first material layer, and forming a second insulating layer in the second material layer, where the first via extends into the second insulating layer in the second material layer, and the second via extends into the first insulating layer in the first material layer.

In another embodiment that is consistent with the present invention, the first via and the second via are filled with a conductive material.

In another embodiment that is consistent with the present invention, the first via reaches an second interconnect in the second insulating layer in the second material layer.

In another embodiment that is consistent with the present invention, the second via reaches a first interconnect in the first insulating layer in the first material layer.

In another embodiment that is consistent with the present invention, the method includes the step of forming an on chip lens over the photodiode.

In another embodiment that is consistent with the present invention, the method includes the step of an on chip color filter between the photodiode and the on chip lens.

In another embodiment that is consistent with the present invention, the first via has a diameter 1.5 to 10 times a diameter of the second via along a common cross section parallel to an interface between the two material layers.

In another embodiment that is consistent with the present invention, the first via has a diameter 3 to 4 times a diameter of the second via along a common cross section parallel to an interface between the two material layers.

In another embodiment that is consistent with the present invention, the device is a backside illuminated device.

In another embodiment that is consistent with the present invention, the first material layer is a semiconductor layer.

In another embodiment that is consistent with the present invention, the second material layer is a semiconductor layer.

In another embodiment that is consistent with the present invention, the device is a backside illuminated device.

In another embodiment that is consistent with the present invention, the first material layer and the second material layer are separate layers.

Another embodiment that is consistent with the present invention includes a solid state imaging device comprising a first material layer adjacent to a second material layer, a first via passing through the first material layer and extending into the second material layer, and a second via extending into the first material layer, where along a common cross section parallel to an interface between the two material layers, the first via has a cross section larger than that of the second via.

Another embodiment that is consistent with the present invention includes an electronic apparatus comprising a first material layer adjacent to a second material layer, a first via passing through the first material layer and extending into the second material layer, and a second via extending into the first material layer, where along a common cross section parallel to an interface between the two material layers, the first via has a cross section larger than that of the second via.

According to the present invention, a plurality of semiconductor wafers having circuits capable of achieving high performance and sufficiently exhibiting performance are stacked using an optimal process technique. Therefore, it is possible to inexpensively obtain a semiconductor apparatus having high performance with high productibility. In addition, it is possible to obtain a high performance electronic apparatus by using a rear-surface illuminated type solid-state imaging apparatus in the semiconductor apparatus and using the solid-state imaging apparatus in the electronic apparatus.

BRIEF DESCRIPTION OF THE DRAWINGS

FIGS. 28A and 28B illustrate an example in which a rear-surface interconnect is used on the rear surface of the first semiconductor substrate and an example in which the rear-surface interconnect is not used.

FIGS. 29A and 29B is an exemplary configuration plan layout with an interconnect connected between stacked chips and a plan layout with an interconnect having a common electric potential that is not connected.

DESCRIPTION OF THE PREFERRED EMBODIMENTS

Hereinafter, an illustrative example of the embodiments of the invention (hereinafter, referred to as an embodiment) will be described. Descriptions will be made in the following sequence.

1. Schematic Configuration Example of MOS type Solid-state Imaging Apparatus
2. First Embodiment (a configuration example of a rear-surface illuminated type solid-state imaging apparatus and an exemplary method of manufacturing the same)
3. Second Embodiment (a configuration example of a semiconductor apparatus and an exemplary method of manufacturing the same)
4. Third Embodiment (a configuration example of a solid-state imaging apparatus and a method of designing the same)
5. Fourth Embodiment (a configuration example of an electronic apparatus)

As is known, a via is an acronym or shorthand for a vertical interconnect access which are a vertical electrical connections between different layers of conductors. While in some uses vias are electrically conductive lined holes, as used herein, a via includes filled and unfilled, but lined, vertical holes. For simplicity, only filled interconnects are illustrated in the following embodiments. The descriptions refer to interconnects, and the term interconnect is to be considered a type of via for the purposes of the description and claims.

Figure 1:
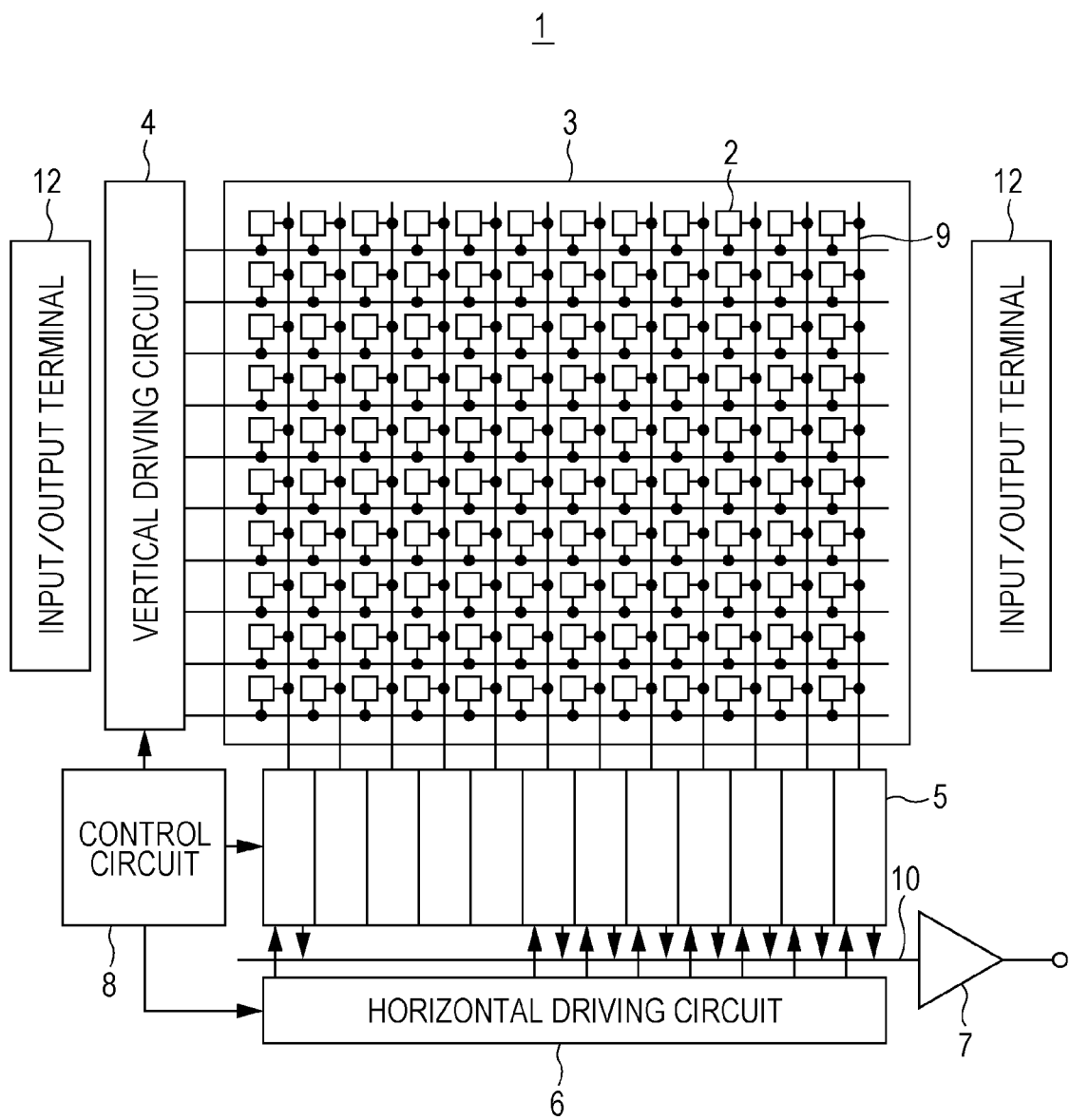
FIG. 1 is a schematic configuration diagram illustrating an exemplary MOS solid-state imaging apparatus according to one embodiment of the present invention.

1. Schematic Configuration Example of MOS Type Solid-State Imaging Apparatus FIG. 1 illustrates a schematic configuration of the MOS type solid-state imaging apparatus applied to the semiconductor apparatus according to the present invention. The MOS type solid-state imaging apparatus is applied to the solid-state imaging apparatuses of each embodiment. The solid-state imaging apparatus 1 of the present example includes a pixel area (so-called pixel array) 3 in which, for example, pixels 2 including a plurality of photoelectric conversion portions are uniformly arranged in a 2-dimensional array on a non-illustrated semiconductor substrate, i.e., a silicon substrate and a peripheral circuit portion. The pixel 2 includes, for example, a photodiode functioning as the photoelectric conversion portion and a plurality of pixel transistors (so-called MOS transistor). A plurality of pixel transistors may include, for example, three transistors including a transmission transistor, a reset transistor, and an amplification transistor. In addition, a selection transistor may be added to provide four transistors. An equivalent circuit of the unit pixel will be described below. The pixel 2 may be constructed as a single unit pixel structure or a sharing pixel structure in which the transistor is shared by a plurality of pixels. In such a sharing pixel structure, a plurality of photodiodes share a floating diffusion included in the transmission transistor and transistors other than the transmission transistor.

The peripheral circuit portion includes a vertical driving circuit 4, a column signal processing circuit 5, a horizontal driving circuit 6, an output circuit 7, a control circuit 8, and the like.

The control circuit 8 receives data for instructing an input clock and an operation mode and outputs data such as internal information of the solid-state imaging apparatus. That is, the control circuit 8 generates a clock signal or a control signal functioning as a reference of the operations of the vertical driving circuit 4, the column signal processing circuit 5, the horizontal driving circuit 6, and the like according to a vertical synchronization signal, a horizontal synchronization signal, and a master clock. In addition, such signals are input to the vertical driving circuit 4, the column signal processing circuit 5, the horizontal driving circuit 6, and the like.

The vertical driving circuit 4 including, for example, shift registers selects the pixel driving interconnect, supplies a pulse for driving the pixels to the selected pixel driving interconnect, and drives the pixels on a row-by-row basis. In other words, the vertical driving circuit 4 selectively and sequentially scans each pixel 2 of the pixel area 3 in a vertical direction on a row-by-row basis and supplies the column signal processing circuit 5 with a pixel signal based on the signal charge generated depending on an amount of light received by the photoelectric conversion portion, e.g., the photodiode, of each pixel 2 through the vertical signal line 9.

The column signal processing circuit 5 is arranged, for example, in each column of the pixel 2 and performs signal processing such as noise removal for each pixel column for the signals output from the pixel 2 corresponding to a single row. That is, the column signal processing circuit 5 performs signal processing such as correlated double sampling (CDS) for removing a unique fixed pattern noise in the pixel 2, signal amplification, A/D conversion, or the like. A horizontal selection switch (not shown) is connected between the output terminal of the column signal processing circuit 5 and the horizontal signal line 10.

The horizontal driving circuit 6 including, for example, shift registers sequentially selects each of the column signal processing circuit 5 by sequentially outputting the horizontal scanning pulse and outputs the pixel signal from each column signal processing circuit 5 to the horizontal signal line 10.

The output circuit 7 performs signal processing for the signals sequentially supplied through the horizontal signal line 10 from each column signal processing circuit 5 and outputs the resulting signals. For example, the output circuit 7 may perform only buffering or perform black level adjustment, column deviation adjustment, various kinds of digital signal processing, and the like. The input/output terminal 12 is used to exchange signals with the external side.

Figure 2A:
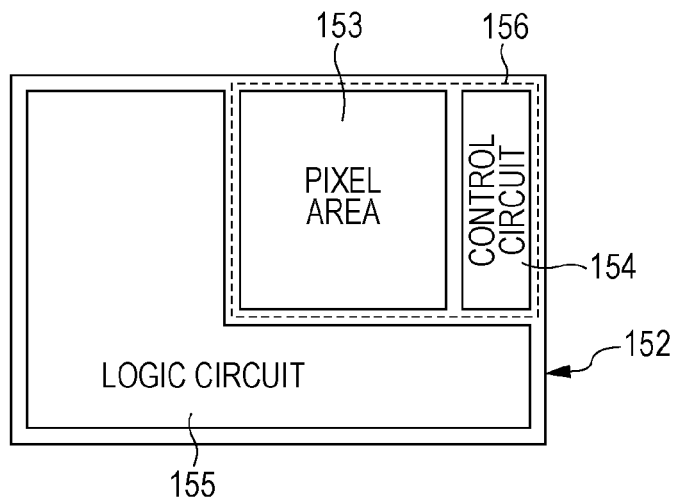
FIG. 2A is a schematic diagram illustrating a solid-state imaging apparatus of the related art.
Figure 2B:
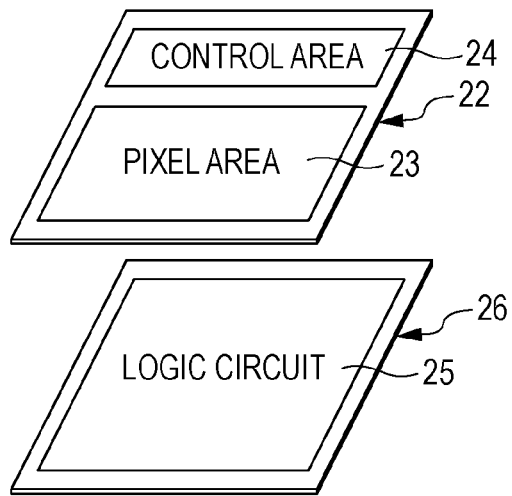
FIGS. 2B and 2C are schematic diagrams illustrating a solid-state imaging apparatus according to one embodiment of the present invention.
Figure 2C:
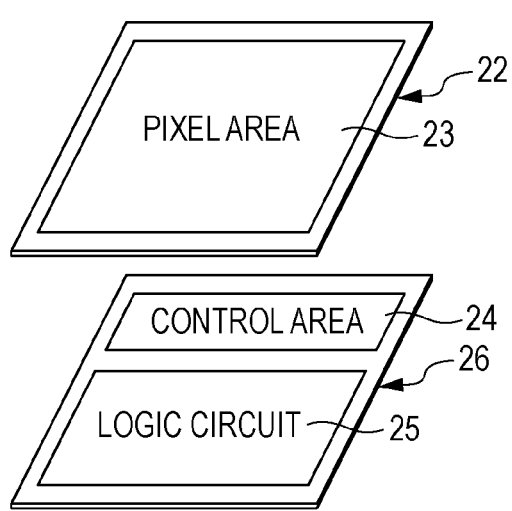

Next, a structure of the MOS type solid-state imaging apparatus according to an embodiment of the invention will be described. FIG. 2A is a schematic configuration diagram illustrating a structure of the MOS type solid-state imaging apparatus of the related art. FIGS. 2B and 2C are schematic configuration diagrams illustrating a structure of the MOS type solid-state imaging apparatus according to an embodiment of the invention.

Referring to FIG. 2A, the MOS type solid-state imaging apparatus 151 of the related art includes a pixel area 153, a control circuit 154, and a logic circuit 155 for signal processing within a single semiconductor chip 152. Typically, the pixel area 153 and the control circuit 154 constitute an image sensor 156.

The MOS type solid-state imaging apparatus 21 according to an embodiment of the invention includes a first semiconductor chip portion 22 where the pixel area 23 and the control area 24 are embedded and a second semiconductor chip portion 26 where the logic circuit 25 including a signal processing circuit for signal processing is embedded as shown in FIG. 2B. The MOS type solid-state imaging apparatus 21 is obtained by electrically connecting the first semiconductor chip portion 22 and the second semiconductor chip portion 26 to each other as a single semiconductor chip.

The MOS type solid-state imaging apparatus 27 according to another embodiment of the invention includes a first semiconductor chip portion 22 where the pixel area 23 is embedded and a second semiconductor chip portion 26 where the control area 24 and the logic circuit 25 including the signal processing circuit are embedded as shown in FIG. 2C. The MOS type solid-state imaging apparatus 27 is obtained by electrically connecting the first semiconductor chip portion 22 and the second semiconductor chip portion 26 to each other as a single semiconductor chip.

Figure 3:
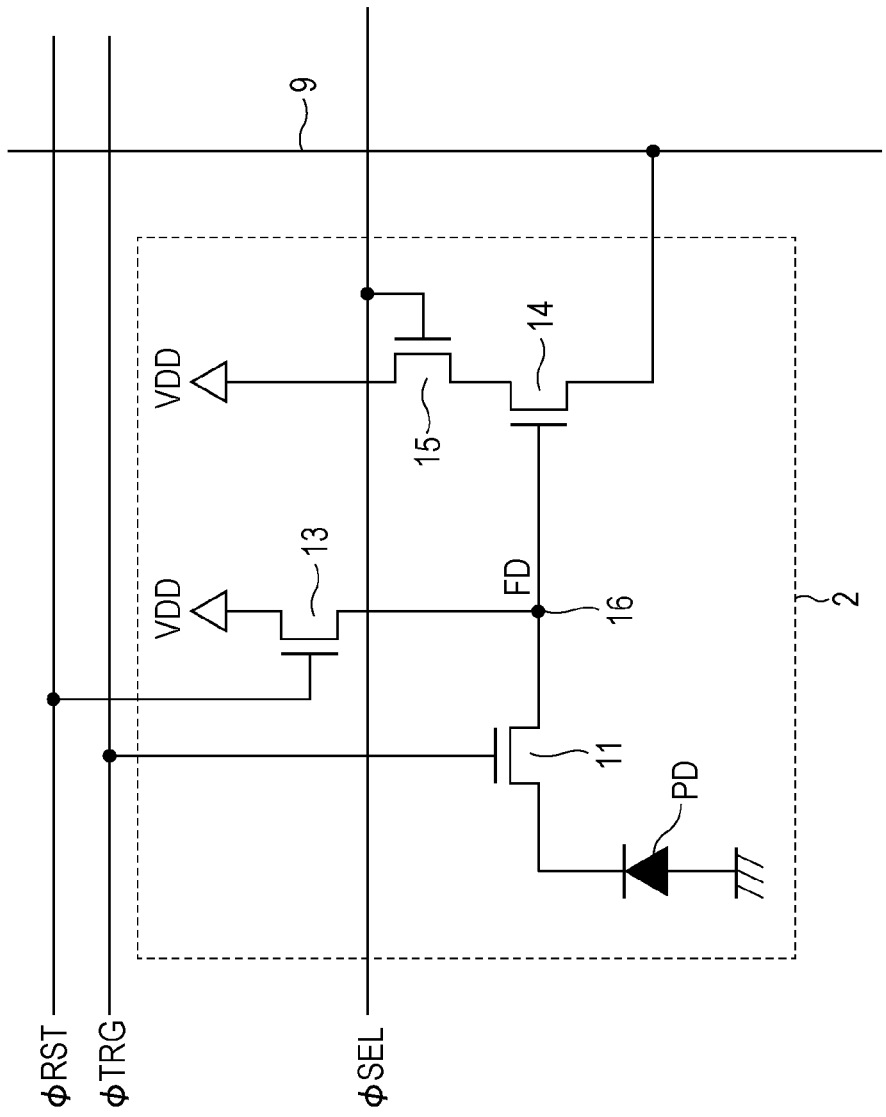
FIG. 3 illustrates an exemplary pixel configuration circuit of the MOS-type solid-state imaging apparatus according to one embodiment of the present invention.

FIG. 3 is a circuit diagram illustrating an exemplary circuit configuration of the unit pixel 2. The unit pixel 2 according to the present circuit example includes a photoelectric conversion portion such as a photodiode (PD) and four pixel transistors. Four pixel transistors include, for example, a transmission transistor 11, a reset transistor 13, an amplification transistor 14, and a selection transistor 15. Such pixel transistors are formed, for example, using an n-channel MOS transistor.

The transmission transistor 11 is connected between the cathode of the photodiode (PD) and the floating diffusion unit 16. The signal charges (in this case, electrons) accumulated here through photoelectric conversion in the photodiode (PD) are transmitted to the floating diffusion unit 16 by applying a transmission pulse φTRG to the gate.

In the reset transistor 13, a drain is connected to the power voltage VDD, and a source is connected to the floating diffusion unit 16. Before transmitting the signal charge from the photodiode (PD) to the floating diffusion unit 16, an electric potential of the floating diffusion unit 16 is reset by applying a reset pulse φRST to the gate.

In the selection transistor 15, for example, a drain is connected to the power voltage VDD, and a source is connected to the drain of the amplification transistor 14. In addition, the selection transistor 15 is turned on by applying a selection pulse φSEL to the gate and, the pixel 2 may be selected by applying the power voltage VDD to the amplification transistor 14. In addition, the selection transistor 15 may be connected between the source of the amplification transistor 14 and the vertical signal line 9.

In the amplification transistor 14, a gate is connected to the floating diffusion unit 16, a drain is connected to the source of the selection transistor 15, and a source is connected to the vertical signal line 9 so as to constitute a source follower. The amplification transistor 14 outputs the electric potential of the floating diffusion unit 16 to the vertical signal line 9 as a reset level after being rest by the reset transistor 13. Furthermore, the amplification transistor 14 outputs the electric potential of the floating diffusion unit 16 as a signal level to the vertical signal line 9 after the signal charge is transmitted by the transmission transistor 11.

In the solid-state imaging apparatus 1 according to an embodiment of the invention, for example, elements such as the photodiode and a plurality of MOS transistors are formed in the first semiconductor chip portion 22 in FIG. 2B or 2C. In addition, the transmission pulse, the reset pulse, the selection pulse, and the power voltage are supplied from the control area 24 of FIG. 2B or 2C. In addition, the elements arranged in a rear stage from the vertical signal line 9 connected to the drain of the selection transistor are included in the logic circuit 25 of FIG. 2B or 2C and formed in the second semiconductor chip portion 26.

The MOS type solid-state imaging apparatus according to the aforementioned embodiment has a stack structure obtained by stacking different semiconductor chips and a manufacturing method thereof and a configuration obtained by the manufacturing method as described below have an advantage.

Hereinafter, a solid-state imaging apparatus according to embodiments of the invention and a method of manufacturing the same will be described.

2. First Embodiment

Exemplary Configuration of Solid-State Imaging Apparatus and Exemplary Method of Manufacturing the Same A rear-surface illuminated type MOS solid-state imaging apparatus as a semiconductor apparatus according to the first embodiment of the invention and a method of manufacturing the same will be described with reference to FIGS. 4 to 19.

Figure 4:
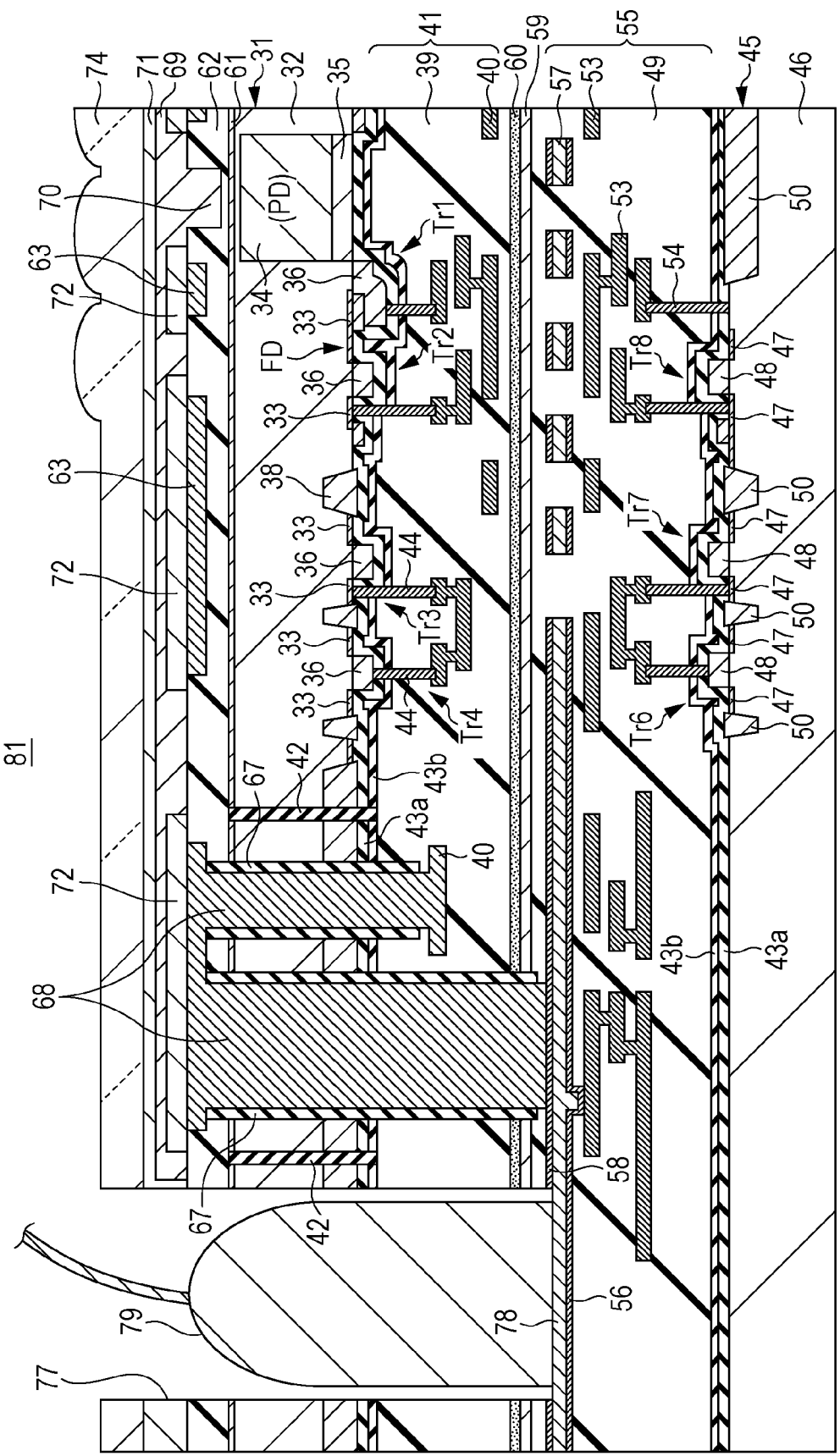
FIG. 4 is a schematic configuration diagram illustrating main parts of the solid-state imaging apparatus according to one embodiment of the present invention.

FIG. 4 is a schematic cross-sectional configuration diagram (completion diagram) including the electrode pad portion 78 of the solid-state imaging apparatus 81 according to an embodiment of the invention. The solid-state imaging apparatus 81 according to the an embodiment of the invention is obtained by vertically stacking a first semiconductor chip portion 22 where the pixel array (hereinafter, referred to as a pixel area) 23 and the control area 24 are included and a second semiconductor chip portion 26 where the logic circuit 25 is embedded while they are electrically connected to each other.

A method of manufacturing the solid-state imaging apparatus 81 according to an embodiment of the invention will be described with reference to FIGS. 5 to 19.

Figure 5:
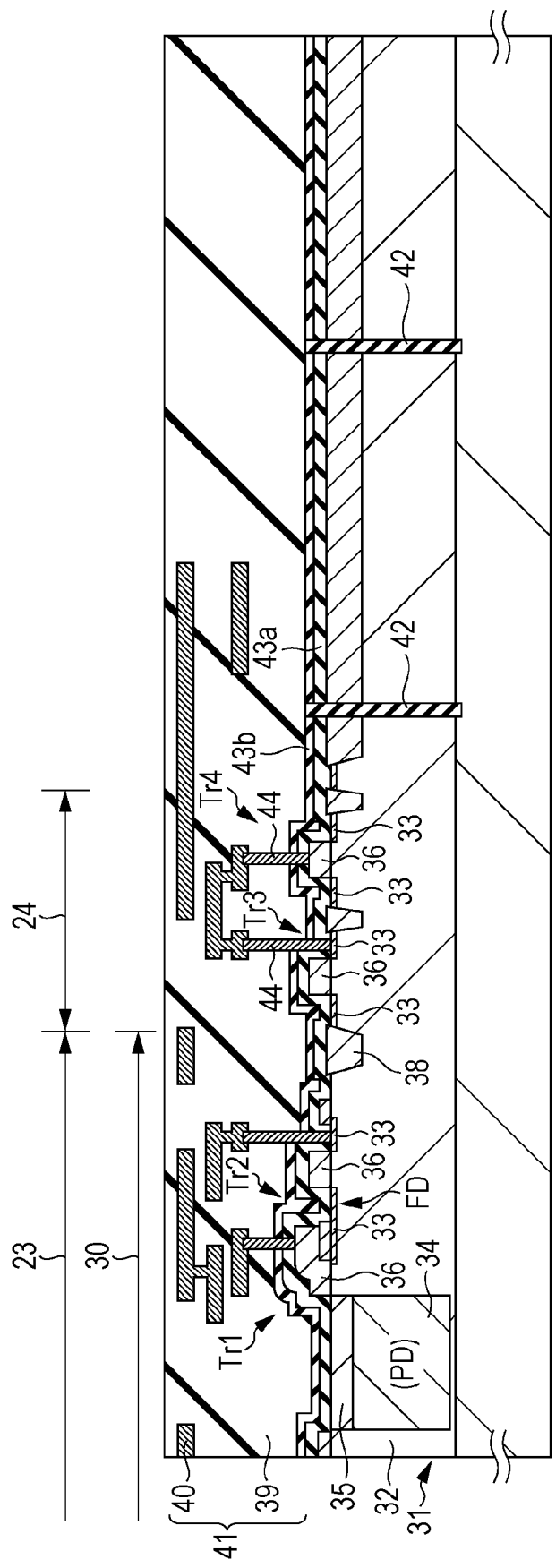
FIG. 5 is a manufacturing process diagram illustrating an exemplary method of manufacturing a solid-state imaging apparatus according to one embodiment of the present invention.

In the first embodiment, first, as shown in FIG. 5, a semi-finished image sensor including the pixel area 23 and the control area 24 is formed in the area corresponding to each chip portion of the first semiconductor wafer 31 (hereinafter, referred to as a first semiconductor substrate). Specifically, a photodiode (PD) corresponding to the photoelectric conversion portion of each pixel is formed in the area corresponding to each chip portion of the first semiconductor substrate 31 made of a silicon substrate, and the source/drain area 33 of each pixel transistor is formed in the semiconductor well area 32 thereof. The semiconductor well area 32 is formed by introducing a first conductivity type, for example, p-type impurity, and the source/drain area 33 is formed by introducing a second conductivity type, for example, n-type impurity. The photodiode (PD) and the source/drain area 33 of each pixel transistor are formed by ion implantation from the substrate surface.

The photodiode (PD) includes an n-type semiconductor area 34 and a p-type semiconductor area 35 provided in the substrate surface side. The gate electrode 36 is formed on the substrate surface included in the pixel through the gate insulation film, and the pixel transistors Tr1 and Tr2 are formed by pairing the source/drain area 33 with the gate electrode 36. In FIG. 5, a plurality of pixel transistors are representatively indicated by two pixel transistors Tr1 and Tr2. The pixel transistor Tr1 adjacent to the photodiode (PD) corresponds to the transmission transistor, and the source/drain area thereof corresponds to the floating diffusion (FD). Each unit pixel 30 is isolated by the element isolation area 38.

Meanwhile, in the control area 24 side, the MOS transistor included in the control circuit is formed on the first semiconductor substrate 31. In FIG. 4, as the MOS transistor included in the control area 24, the MOS transistors Tr3 and Tr4 are representatively illustrated. Each MOS transistor Tr3 and Tr4 includes an n-type source/drain area 33 and a gate electrode 36 formed by interposing a gate insulation film.

Next, the interlayer insulation film 39 of the first layer is formed on the surface of the first semiconductor substrate 31, a contact hole is formed in the interlayer insulation film 39, and then, the connection conductor 44 connected to a necessary transistor is formed. In order to form the connection conductor 44 having a different height, the first insulation thin-film 43a, for example, a silicon oxide film formed on the entire surface including the transistor surface and the second insulation thin-film 43b functioning an etching stopper formed of, for example, a silicon nitride film are stacked. The interlayer insulation film 39 of the first layer is formed on the second insulation thin-film 43b. The interlayer insulation film 39 of the first layer may be formed by depositing, for example, a P—SiO film (plasma oxide film) having a thickness of 10 to 150 nm, forming a non-doped silica glass (NSG) film or a phosphor silicate glass (PSG) film having a thickness of 50 to 1000 nm, and depositing a dTEOS film having a thickness of 100 to 1000 nm, and then, depositing a P—SiH$_4$ film (plasma oxide film) having a thickness of 50 to 200 nm.

Then, in the interlayer insulation film 39 of the first layer, a contact hole having a different depth is selectively formed to reach the second insulation thin-film 43b functioning as an etching stopper. Subsequently, the contact holes are formed by selectively etching the first insulation thin-film 43a and the second insulation thin-film 43b having the same thickness in each portion such that they are succeeded in each contact hole. In addition, the connection conductor 44 is buried in each contact hole.

After forming the second insulation thin-film 43b, an insulation spacer layer 42 for isolating a desired area within the semiconductor well area 32 of the first semiconductor substrate 31 is formed. The insulation spacer layer 42 is formed by opening a desired position in the first semiconductor substrate 31 from the surface side and burying an insulation material after forming the second insulation thin-film 43b. The insulation spacer layer 42 is formed in the area surrounding the interconnect 68 between the first and second semiconductor substrates in FIG. 4.

Next, a first wiring layer 41 is formed by forming a copper interconnect 40 having a plurality of layers, in the present example, a three-layer with the interlayer insulation film 39 being interposed such that they are connected to each connection conductor 44. Typically, each copper interconnect 40 is covered by a barrier metal layer (not shown) in order to prevent diffusion of copper (Cu). The barrier metal layer may be formed by depositing, for example, a SiN film or a SiC film having a thickness of 10 to 150 nm. In addition, the interlayer insulation films 39 of the second and subsequent layers may be formed by depositing the dTEOS film (a silicon oxide film formed using a plasma chemical vapor deposition (CVD) method) having a thickness of 100 to 1000 nm. By alternately forming the interlayer insulation film 39 and the copper interconnect 40 with the barrier metal layer being interposed, the first wiring layer 41 is formed. While the first wiring layer 41 formed of the copper interconnect 40 is exemplified in the present embodiment, other metal materials may be used as the metal interconnect.

Through the aforementioned process, a semi-finished first semiconductor substrate 31 including the pixel area 23 and the control area 24 is formed to have the first wiring layer 41, on the upper portion.

Figure 6:
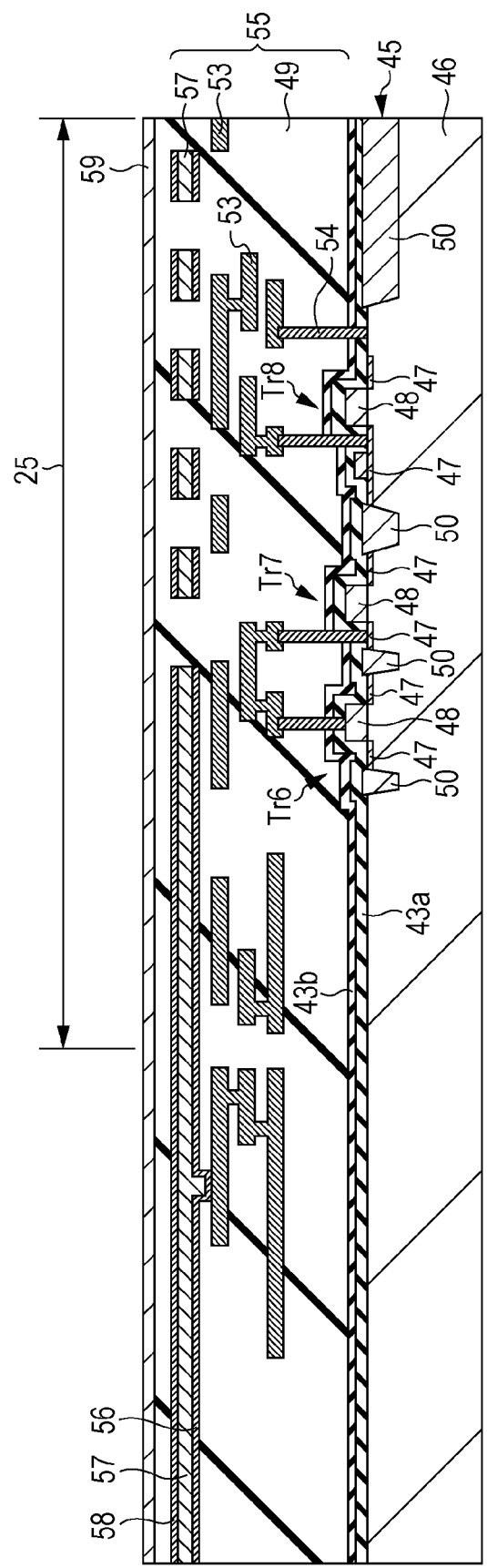
FIG. 6 is a manufacturing process diagram illustrating an exemplary method of manufacturing a solid-state imaging apparatus according to one embodiment of the present invention.

Meanwhile, as shown in FIG. 6, a semi-finished logic circuit 25 including a signal processing circuit for signal process is formed in the area corresponding to each chip area of the second semiconductor substrate (semiconductor wafer) 45, for example, made of silicon. Specifically, a plurality of MOS transistors included in the logic circuit 25 are formed in p-type semiconductor well area 46 on the surface of the second semiconductor substrate 45 such that they are isolated by the element isolation area 50. Here, the MOS transistors Tr6, Tr7, and Tr8 are representatively illustrated as a plurality of MOS transistors. Each MOS transistor Tr6, Tr7, and Tr8 includes a single n-type source/drain region 47 and a gate electrode 48 formed by interposing the gate insulation film. The logic circuit 25 may be made from a CMOS transistor.

Next, the interlayer insulation film 49 of the first layer is formed on the surface of the second semiconductor substrate 45, the contact hole is formed in the interlayer insulation film 49, and then, the connection conductor 54 for connection to a desired transistor is formed. In order to form the connection conductor 54 having a different height, as described above, the first insulation thin-film 43a, for example, a silicon oxide film functioning as an etching stopper and the second insulation thin-film 43b, for example, a silicon nitride film are stacked on the entire surface including the transistor surface. The interlayer insulation film 49 of the first layer is formed on the second insulation thin-film 43b. In addition, the contact hole having a different depth is selectively formed on the interlayer insulation film 39 of the first layer to reach the second insulation thin-film 43b functioning as an etching stopper. Subsequently, the contact holes are formed by selectively etching the first insulation thin-film 43a and the second insulation thin-film 43b having the same thickness in each portion such that they are succeeded in each contact hole. In addition, the connection conductor 54 is buried in each contact hole.

Then, by repeating formation of the interlayer insulation film 49 and formation of the multilayered metal interconnect, the second wiring layer 55 is formed. In the present embodiment, it is assumed that the aluminum interconnect 57 is formed on the uppermost layer after the three-layer copper interconnect 53 is formed in a similar way to the process of forming the first wiring layer 41 on the first semiconductor substrate 31. In order to form the aluminum interconnect 57, first, the interlayer insulation film 49 is formed on the copper interconnect 53 of the uppermost layer, and then, the contact hole is formed by etching out the interlayer insulation film 49 to expose a desired position on the copper interconnect 53 of the uppermost layer. In addition, a stack film having thickness of 5 to 10 nm made of TiN(lower layer)/Ti(upper layer) functioning as a barrier metal layer 56 and a stack film having a thickness of 10 to 100 nm made of TaN(lower layer)/Ta(upper layer) are deposited in the area including the internal side of the contact hole. Then, aluminum is coated on the contact hole to a thickness of 500 to 2000 nm and patterned in a desired shape so that the aluminum interconnect 57 is formed. Furthermore, the barrier metal layer 58 necessary in the subsequent process is deposited on the aluminum interconnect 57. The barrier metal layer 58 is also made to have the same configuration as that of the barrier metal layer 56 deposited in the lower layer of the aluminum interconnect 57.

Subsequently, the interlayer insulation film 49 is deposited by coating the aluminum interconnect 57 having the barrier metal layer 58 thereon. The interlayer insulation film 49 overlying the aluminum interconnect 57 may be formed by depositing, for example, a high density plasma oxide film (HDP film) or P—SiO film (plasma oxide film) to a thickness of 500 to 2000 nm and then depositing a P—SiO film having a thickness of 100 to 2000 nm thereon. Through the aforementioned process, it is possible to form a second wiring layer 55 including a three-layer copper interconnect 53 with the interlayer insulation film 49 being interposed and the aluminum interconnect 57 formed on the uppermost layer.

In addition, a warping correction film 59 for alleviating a warping state generated when the first semiconductor substrate 31 and the second semiconductor substrate 45 are bonded is formed on the second wiring layer 55. The warping correction film 59 may be formed by depositing, for example, a P—SiN film or a P—SiON film (plasma nitrogen oxide film) having a thickness of 100 to 2000 nm.

Through the aforementioned process, it is possible to form a second semiconductor substrate 45 in which the second wiring layer 55 is provided in the upper portion, and a semi-finished logic circuit is constructed.

Figure 7:
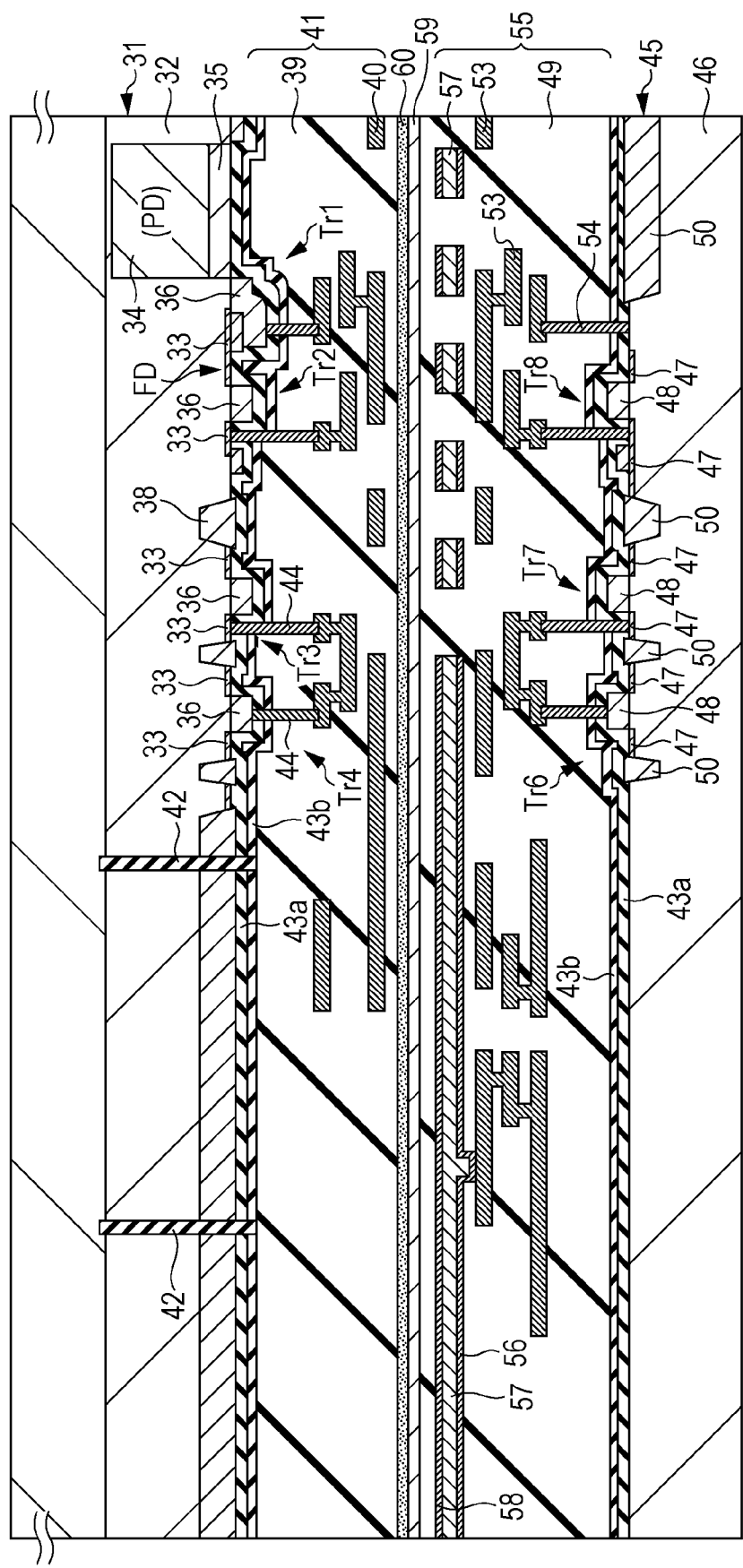
FIG. 7 is a manufacturing process diagram illustrating an exemplary method of manufacturing a solid-state imaging apparatus according to one embodiment of the present invention.

Next, as shown in FIG. 7, the first semiconductor substrate 31 and the second semiconductor substrate 45 are bonded or secured to each other such that the first wiring layer 41 and the second wiring layer 55 face each other. The bonding may be performed using an adhesive or by any other method which can adhere the two substrates together, one of example of which is direct bonding. When an adhesive is used in bonding, the adhesive layer 60 is formed on one of the bonding surfaces of the first semiconductor substrate 31 or the second semiconductor substrate 45, and they are overlapped and bonded with each other by interposing the adhesive layer 60. In the present embodiment, the first and second semiconductor substrate 31 and 45 are bonded to each other while the first semiconductor substrate 31 including the pixel area is arranged in the upper layer, the second semiconductor substrate 45 is arranged in the lower layer.

In addition, in the present embodiment, while the first wiring layer 41 provided in the upper portion of the first semiconductor substrate 31 and the second wiring layer 55 provided in the upper portion of the second semiconductor substrate 45 are bonded by interposing the adhesive layer 60 therebetween, they may be bonded using other methods such as plasma bonding. In the case of plasma bonding, a plasma TEOS film, a plasma SiN film, a SiON film (block film), an SIC film, or the like is formed on each of the bonding surfaces of the first wiring layer 41 and the second wiring layer 55. The bonding surfaces formed on these films are plasma-processed and overlapped, and they are bonded to each other by annealing. The bonding process is preferably performed using a low-temperature process equal to or lower than 400° C. that does not influence the interconnect or the like.

Then, the first semiconductor substrate 31 and the second semiconductor substrate 45 having the wiring layer in the upper portion are stacked and bonded so that a stack structure 81*a* including two different kinds of substrates is formed.

Figure 8:
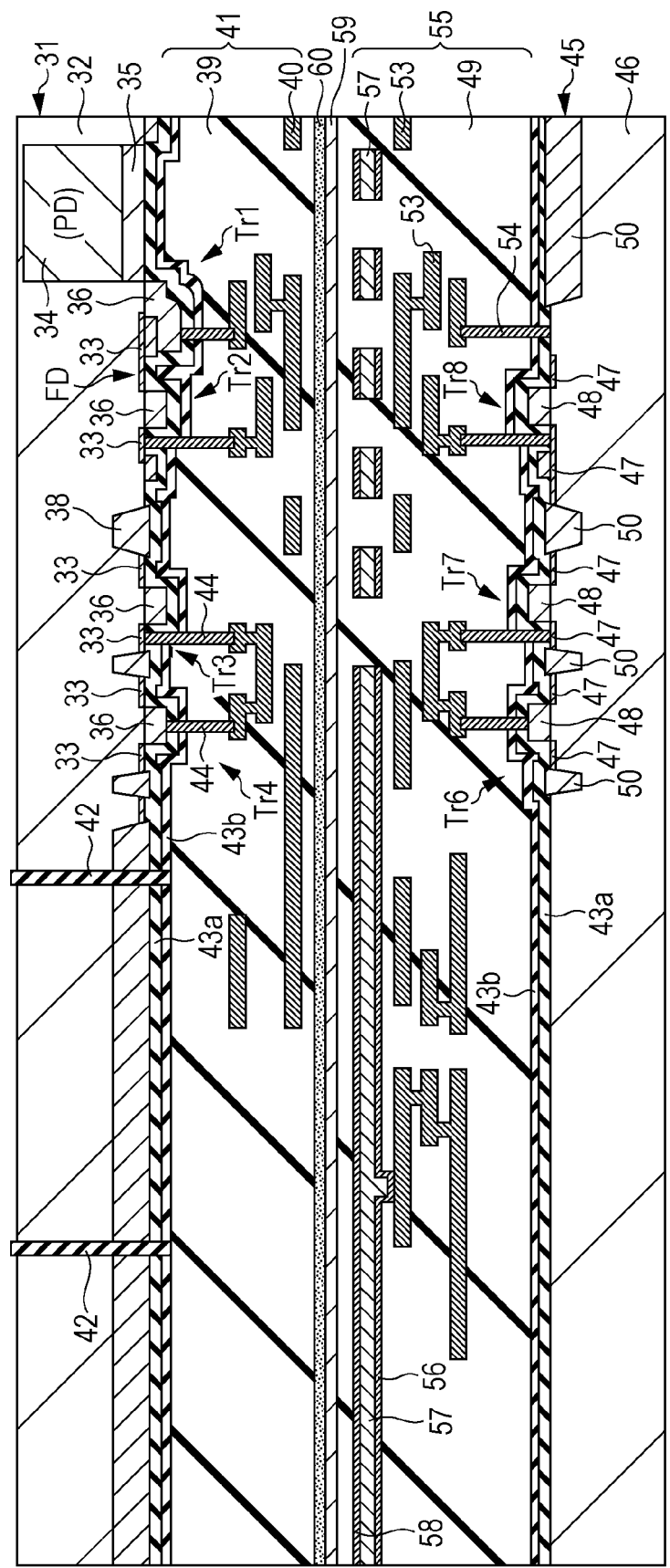
FIG. 8 is a manufacturing process diagram (illustrating an exemplary method of manufacturing a solid-state imaging apparatus according to one embodiment of the present invention.

Next, as shown in FIG. 8, the first semiconductor substrate 31 is thinned by performing grinding or polishing from the rear surface of the first semiconductor substrate 31. The thinning is performed to reach the photodiode (PD). As the first semiconductor substrate 31, for example, a semiconductor substrate formed by using a p-type high concentration impurity layer as an etching stopper layer (not shown) is used, and the substrate may be flattened and thinned by etching out the substrate to the etching stopper layer. After the thinning, a p-type semiconductor layer (not shown) for suppressing a dark current on the rear surface of the photodiode (PD) is formed. Although the first semiconductor substrate 31 has a thickness of, for example, 600 μm, the thinning is performed, for example, up to 3 to 5 μm.

In the related art, such a thinning was performed by bonding a separate support substrate to the first wiring layer 41 formed on the first semiconductor substrate 31. However, in the present embodiment, the first semiconductor substrate 31 is thinned by using the second semiconductor substrate 45 having the logic circuit 25 as the support substrate. The rear surface of the first semiconductor substrate 31 becomes the light incident surface when it is constructed as the rear-surface illuminated type solid-state imaging apparatus.

Figure 9:
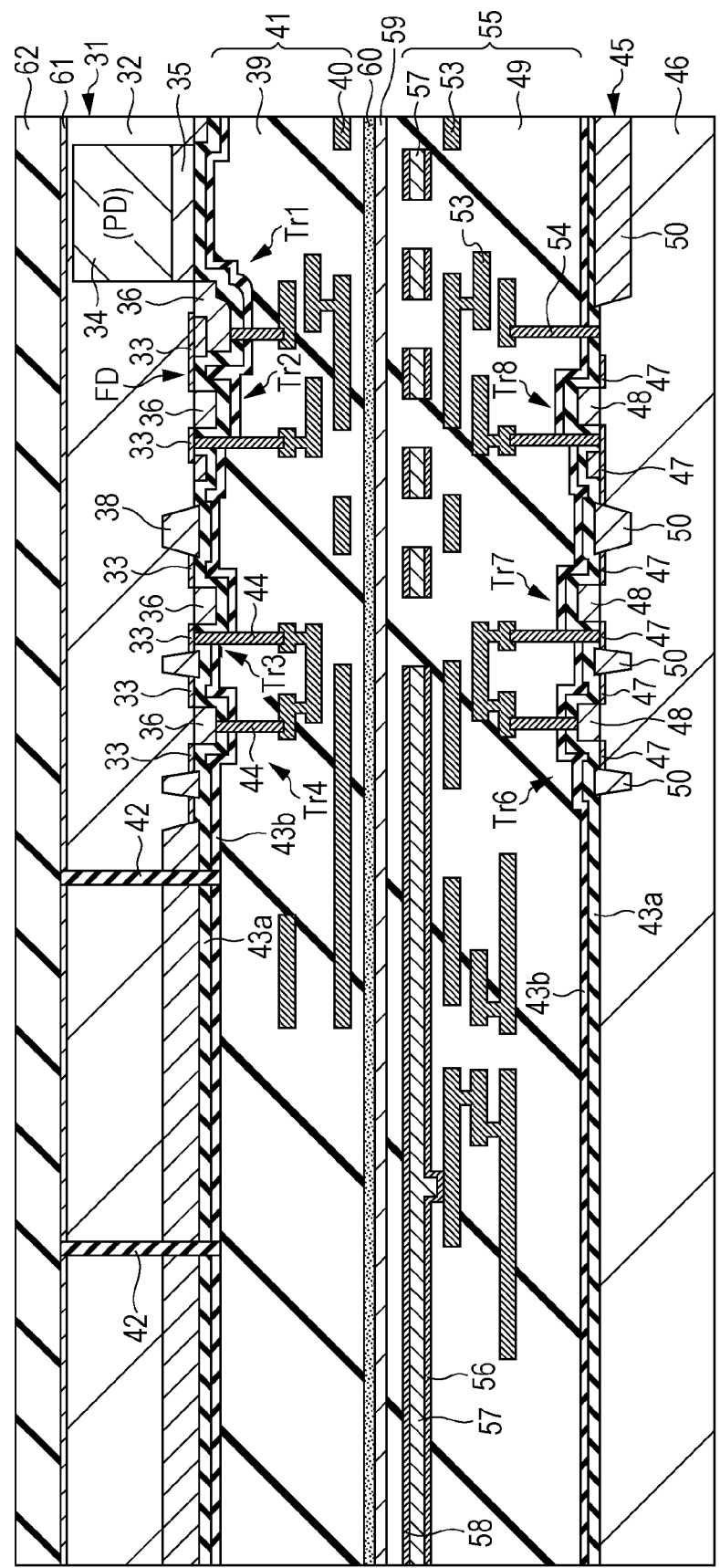
FIG. 9 is a manufacturing process diagram illustrating an exemplary method of manufacturing a solid-state imaging apparatus according to one embodiment of the present invention.

Next, as shown in FIG. 9, the anti-reflection film 61 is formed on the rear surface of the first semiconductor substrate 31. It is possible to add an effect of suppressing a dark current by forming the anti-reflection film 61 having a thickness of 5 to 100 nm using, for example, $TaO_2$ or $HfO_2$, and performing a desired heat treatment. Then, the insulation film 62 is formed by depositing the plasma SiO film having a thickness of 100 to 1500 nm on the anti-reflection film 61.

Figure 10:
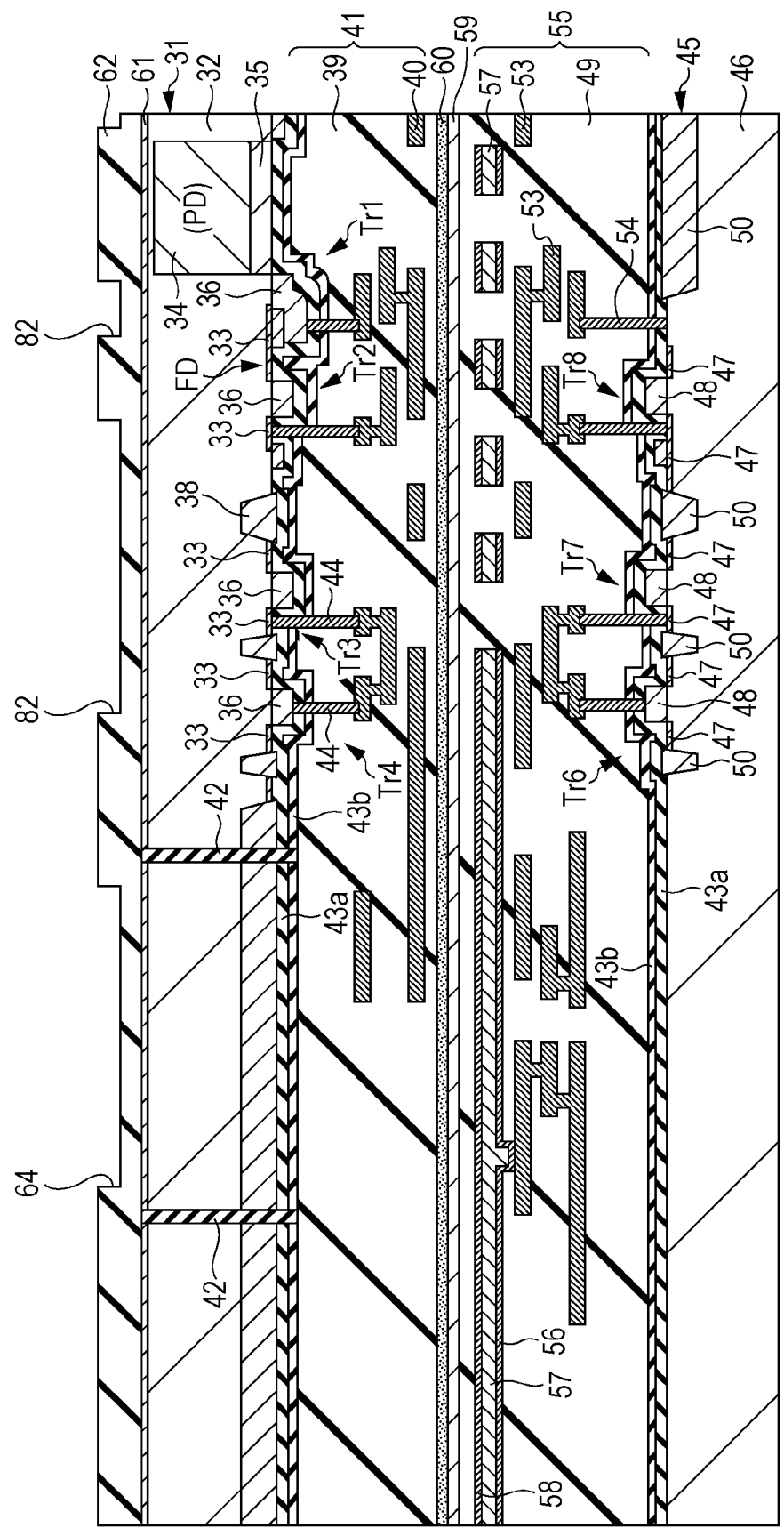
FIG. 10 is a manufacturing process diagram illustrating an exemplary method of manufacturing a solid-state imaging apparatus according to one embodiment of the present invention.

Next, as shown in FIG. 10, a trench portion 64 is formed in a desired area inside the insulation spacer layer 42, and a light shielding film trench portion 82 is formed in the light shielding area where light shielding is necessary. The trench portion 64 and the light shielding film trench portion 82 are formed by forming an opening through etching from the surface of the insulation film 62 formed on the rear surface of the first semiconductor substrate 31. For example, they are formed to have a depth that does not reach the first semiconductor substrate 31.

Figure 11:
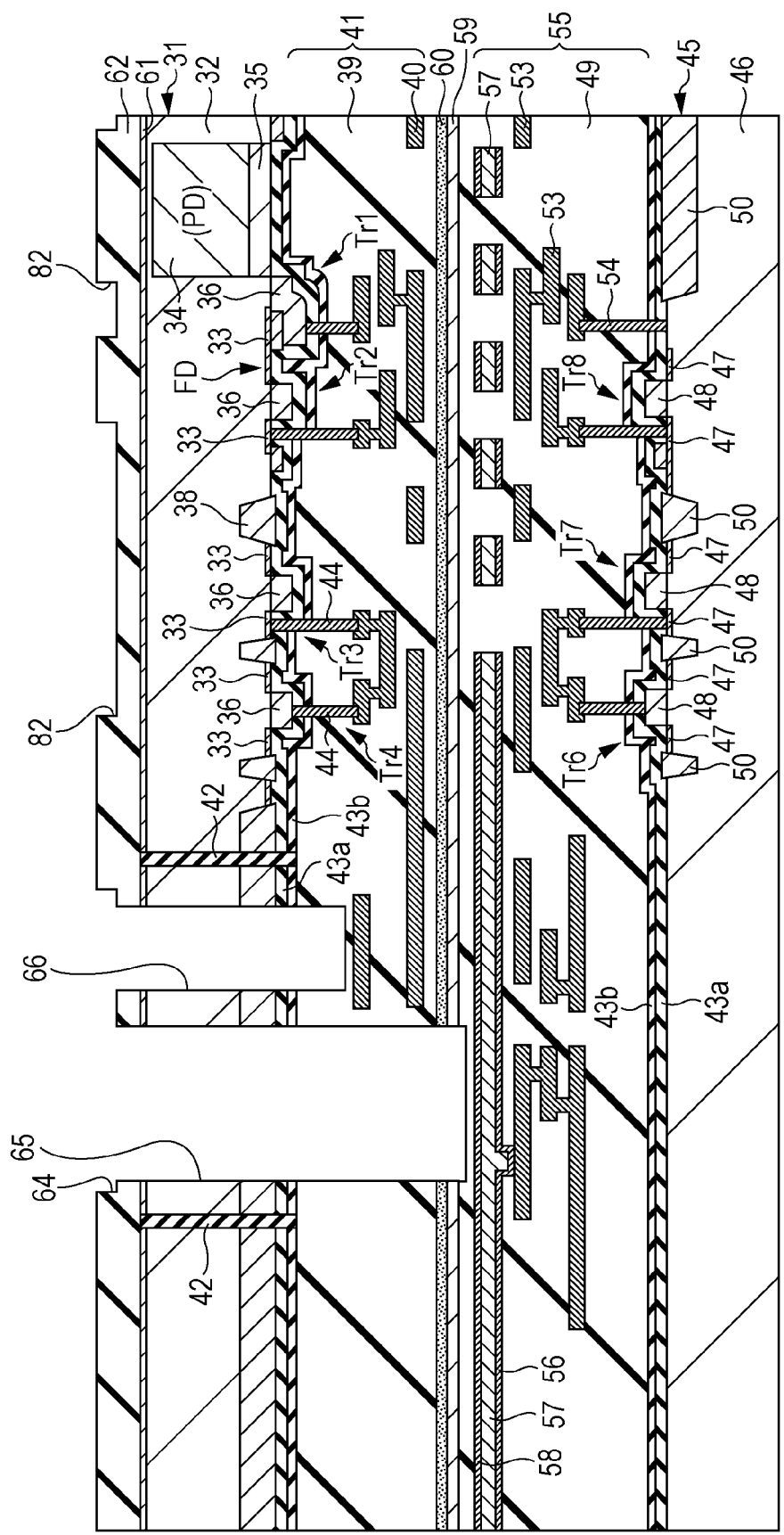
FIG. 11 is a manufacturing process diagram illustrating an exemplary method of manufacturing a solid-state imaging apparatus according to one embodiment of the present invention.

Next, as shown in FIG. 11, the connection hole 66 is formed by making an opening in the first wiring layer 41 and subjecting the opening to etching. Consistent with this embodiment, the opening is continuously etched to a depth that extends to, but does not reach, the copper interconnect 40 of the lowermost layer (in FIG. 11, the uppermost side) of the first wiring layer 41 from a desired bottom area of the trench portion 64 formed inside the insulation spacer layer 42.

A through-connection hole 65 is also formed by making an opening in the first wiring layer 41 and subjecting the opening to etching. Consistent with this embodiment, the opening is etched such that the opening passes through a bonding surface between the first wiring layer 41 and the second wiring layer 55 from a desired bottom area of the trench portion 64 formed inside the insulation spacer layer 42 and continues until the opening is at a depth immediately before the uppermost layer 57 of the second wiring layer 55 overlying the second semiconductor substrate 45.

A horizontal cross section parallel to an interface between the first wiring layer 41 and the second wiring layer 55 of each opening determines the depth of the finished connection hole 66 or through connection hole 65 because given a large cross section, for the same exposure to the etching process, the etched depth will be greater. In one embodiment that is consistent with the present invention, the cross section of the through-connection hole 65 is 1.5 to 10 times, more preferably, 3 to 4 times the cross section of the connection hole 66. It can be appreciated that the cross section of a via or interconnect created using the through connection hole is 1.5 to 10 times, more preferably, 3 to 4 times the cross section of a via or interconnect created using the connection hole 66. It will also be appreciated that the cross sections of the connection holes are also so related.

In the case where the cross section of the through-connection hole. 65 is smaller than 1.5 times the cross section of the connection hole 66, the aspect ratio of the through-connection hole 65 increases so that voids may be generated when a conductive material is buried in the hole in the subsequent process. In addition, in the case where the cross section of the through-connection hole 65 is larger than 10 times the cross section of the connection hole 66, the area occupied by the through-connection hole 65 increases, so that it is difficult to achieve miniaturization of the device. Therefore, by setting the cross section of the through-connection hole 65 to 1.5 to 10 times the cross section of the connection hole 66, it is possible to form a hole having an optimal aspect ratio to bury the conductive material without increasing layout space. In one embodiment that is consistent with the present invention, openings are substantially circular with a diameter of the through connection hole 65 is larger than a diameter of the connection hole 64. It can be appreciated that the cross-sectional shapes of the openings and the fill material are defined by the process used to create the opening and that the shape of the opening and, consequently the fill material, can be circular or non circular or irregular.

Since the connection hole 66 and the through-connection hole 65 are formed after thinning the first semiconductor substrate 31 (the process of FIG. 8), it is possible to reduce an aspect ratio and form a fine hole. In addition, since the connection hole 66 is formed by making an opening immediately before reaching the lowermost layer of the first wiring layer 41 in the upper portion of the first semiconductor substrate 31, i.e., the copper interconnect 40 located in a closest side to the first semiconductor substrate 31, the depth of the opening is reduced, so that it is advantageous to form a fine hole.

In one embodiment consistent with the present invention, the through-connection hole 65 and the connection hole 66 are formed simultaneously. Consistent with this embodiment, the cross sections of the openings are selected such that the opening for the through connection hole 65 is larger than the opening for the connection hole 66. Further the cross sections of the openings are selected such that the opening for the connection hole 66 is etched to a depth that reaches, but does not connect, the copper interconnect 40 of the lowermost layer (in FIG. 11, the uppermost side) and such that the through connection hole 65 is etched through a bonding surface between the first wiring layer 41 and the second wiring layer 55 is retched to a depth immediately before the uppermost layer 57 of the second wiring layer 55 overlying the second semiconductor substrate 45.

To create the connection hole 66 and the through connection hole 65, both openings are simultaneously subjected to the same etching process such that the connection hole 66 and the through connection hole 65 are formed. Because the two openings have different cross sections, the openings are etched to different depths when exposed to the same etching process. Accordingly, by adjusting the initial cross sections of the openings, the depths of the connection hole 66 and the through connection hole 65 can be controlled to a desired depth.

Figure 12:
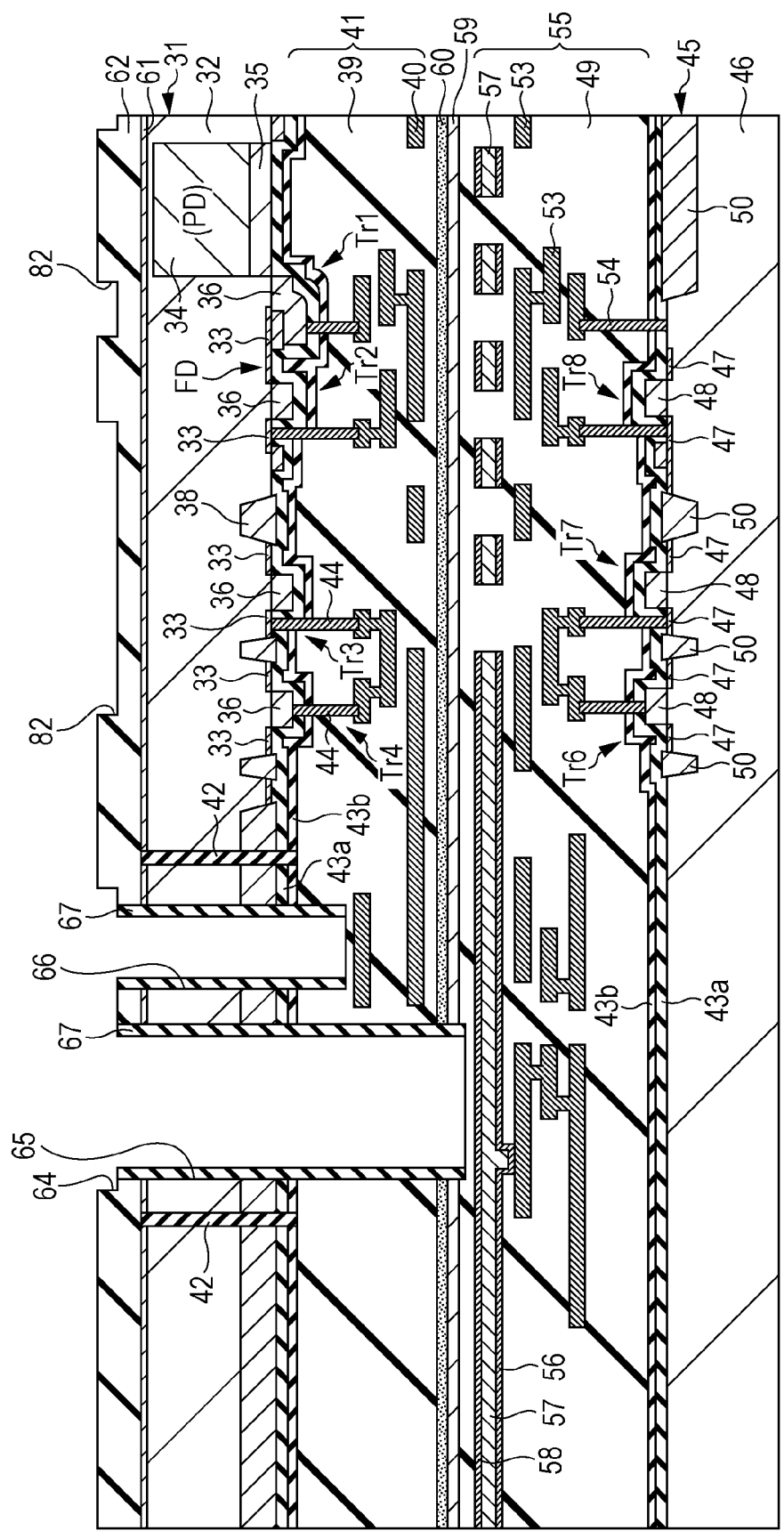
FIG. 12 is a manufacturing process diagram illustrating a method of manufacturing a solid-state imaging apparatus according to one embodiment of the present invention.

Next, an insulation layer 67 made from, for example, a $SiO_2$ film is deposited in the area including the side walls and the bottom portions of the connection hole 66 and the through-connection hole 65 and etched back. As a result, as shown in FIG. 12, the insulation layer 67 remains only in the side walls of the connection hole 66 and the through-connection hole 65. Then, the bottom portions of the connection hole 66 and the through-connection hole 65 are further etched out. As a result, in the connection hole 66, the copper interconnect 40 of the lowermost layer of the first wiring layer 41 is exposed. In the through-connection hole 65, the aluminum interconnect 57 of the uppermost layer of the second wiring layer 55 is exposed (strictly to say, the barrier metal layer 58 overlying the aluminum interconnect).

As a result, the connection hole 66 reaches the copper interconnect 40 of the first wiring layer 41. In addition, the through-connection hole 65 passes through the bonding surface between the first wiring layer 41 and the second wiring layer 55 and reaches the aluminum interconnect 57 formed in the second wiring layer 55.

At this moment, a process of fabricating the on-chip color filter or the on-chip lens as a process of manufacturing the pixel array still has not been finished, and thus, the product is uncompleted. In addition, the connection hole 66 formed on the copper interconnect 40 and the through-connection hole 65 formed on the aluminum interconnect 57 may be fabricated or formed by extending the wafer process of the related art. On the other hand, the logic circuit 25 is also uncompleted since it is considered optimal to finish a process of forming the metal interconnect in the uppermost layer as a circuit technique. In this manner, since different kinds of semi-finished substrates are bonded, it is possible to reduce manufacturing costs in comparison with the case where different kinds of finished substrates are bonded.

Figure 13:
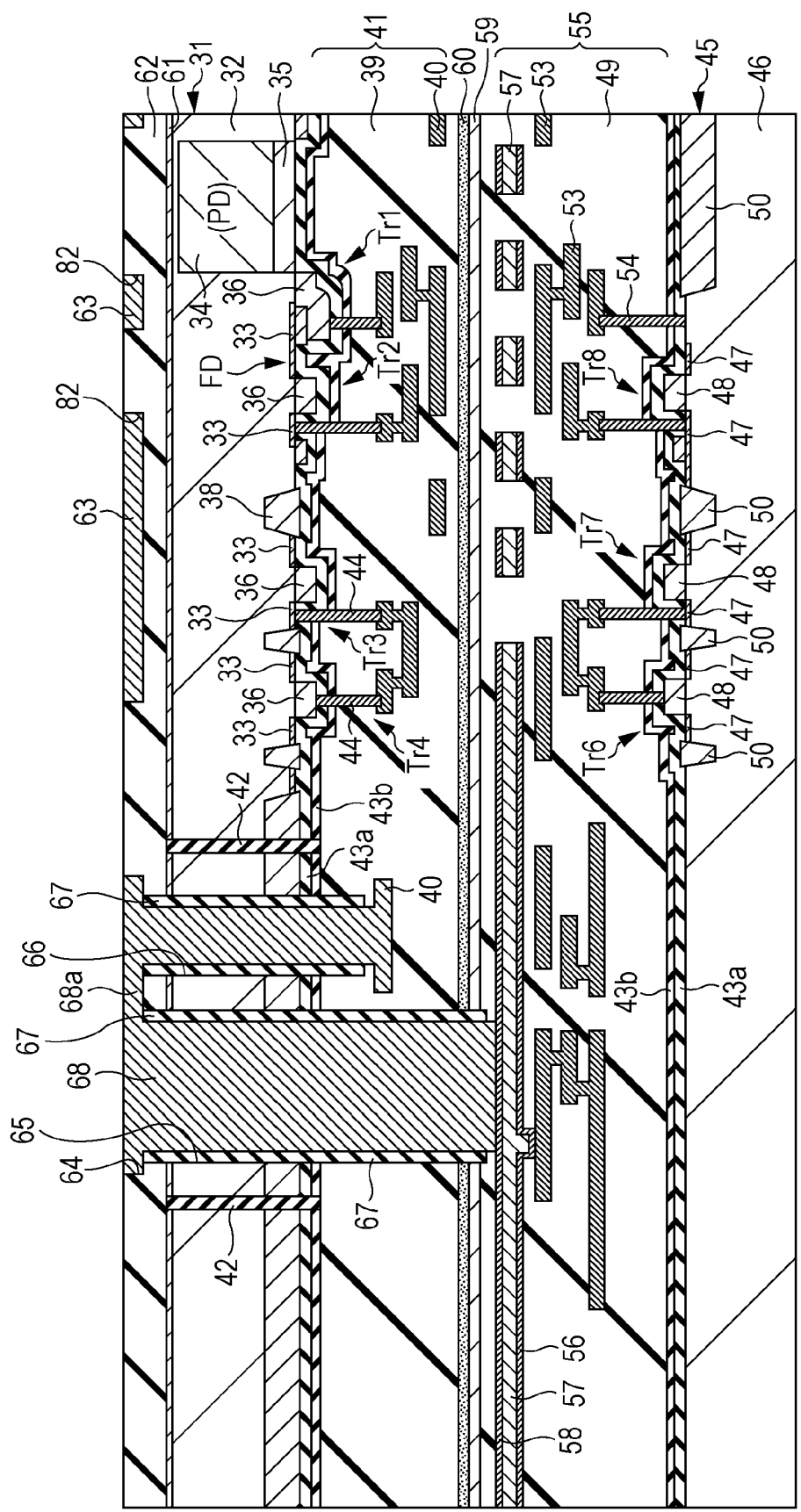
FIG. 13 is a manufacturing process diagram illustrating a method of manufacturing a solid-state imaging apparatus according to one embodiment of the present invention.

Then, as shown in FIG. 13, a conductive material such as copper is formed in an area including the trench portion 64, the light shielding film trench portion 82, the connection hole 66, and the through-connection hole 65, and the surface is polished using a chemical mechanical polishing (CMP) method. As a result, only the conductive material of the trench portion 64, the light shielding film trench portion 82, the connection hole 66, and the through-connection hole 65 remains. As a result, the interconnect 68 between the first and second semiconductor substrates is formed in the area within the insulation spacer layer 42, and the light shielding film 63 is formed in the light shielding area. In the present embodiment, the interconnect 68 between the first and second semiconductor substrates formed in the connection hole 66 and the interconnect 68 between the first and second semiconductor substrates formed in the through-connection hole 65 are electrically connected by the connection interconnect 68a made from the damascene interconnect formed in the trench portion 64. In addition, the light shielding film 63 is also formed using the damascene method. In addition, by burying a conductive material in the trench portion 64, the light shielding film trench portion 82, the connection hole 66, and the through-connection hole 65, the copper interconnect 40 formed in the first wiring layer 41 and the aluminum interconnect 57 formed in the second wiring layer 55 are electrically connected.

In this case, since the barrier metal layer 58 is formed on the aluminum interconnect 57 formed in the second wiring layer 55 of the second semiconductor substrate 45, diffusion of copper is prevented even when the interconnect 68 between the upper and lower semiconductor substrates is made of copper. In addition, the insulation layer 67 is formed in the sidewalls passing through the first semiconductor substrate 31 inside the holes of the connection hole 66 and the through-connection hole 65. Therefore, the interconnect 68 between the first and second semiconductor substrates and the first semiconductor substrate 31 are electrically isolated and are not connected. In addition, in the present embodiment, the interconnect 68 between the semiconductor substrates is formed within the area of the insulation spacer layer 42 formed in the first semiconductor substrate 31. For this reason, electrical connection between the interconnect 68 between the first and second semiconductor substrates and the first semiconductor substrate 31 is also prevented.

In the process of forming the interconnect 68 between the first and second semiconductor substrates according to the present embodiment, the trench portion 64, the light shielding film trench portion 82, the connection hole 66, and the through-connection hole 65 are formed through three stages, and a damascene method in which copper is buried is used. However, the present invention is not limited thereto. Various modifications can be made if the interconnect 68 between the first and second semiconductor substrates for electrically connecting the copper interconnect 40 of the first wiring layer 41 in the upper portion of the first semiconductor substrate 31 and the aluminum interconnect 57 of the second wiring layer 55 in the upper portion of the second semiconductor substrate 45 is formed.

For example, the interconnect 68 between the first and second semiconductor substrates may be formed using a CVD method or a sputtering method. Alternatively, the interconnect 68 between the first and second semiconductor substrates may be formed using a typical lithography or dry etching. However, it is difficult to allow sensitivity degradation just by stacking the interconnect layers. Therefore, a damascene interconnect structure is preferably applied because it has a little number of insulation film stacks.

In the present embodiment, while the light shielding film trench portion 82 for forming the light shielding film 63 is simultaneously fabricated with the trench portion 64 for forming the interconnect 68 between the first and second semiconductor substrates, the light shielding film trench portion 82 may be formed after forming the trench portion 64, the connection hole 66, the through-connection hole 65, and the insulation spacer layer 42. Even in this case, the light shielding film trench portion 82 is formed in the same layer as that of the trench portion 64, and a conductive material is buried in the light shielding film trench portion 82 simultaneously with the trench portion 64, the connection hole 66, and the through-connection hole 65. Since the light shielding film trench portion 82 is fabricated simultaneously with the trench portion 64, the connection hole 66, and the through-connection hole 65, the process is simplified. However, in this case, the insulation spacer layer 42 is also formed in the light shielding film trench portion 82 when the insulation spacer layer 42 is formed, and it may be difficult to obtain a desired line width of the light shielding film 63. When miniaturization of the pixel progresses, it is more preferable that the light shielding film trench portion 82 is formed using a separate process from those of the trench portion 64, the connection hole 66, and the through-connection hole 65.

In the related art, the light shielding film 63 is separately formed using tungsten, aluminum, or the like in the process before forming the interconnect 68 between the first and second semiconductor substrates. However, it is possible to simplify the process by forming the light shielding film 63 simultaneously with the interconnect 68 between the first and second semiconductor substrates using the damascene method. In addition, since it is possible to reduce the thickness of the insulation film in the light receiving portion side (rear surface side) of the first semiconductor substrate 31 and attribute to improvement of sensitivity.

Furthermore, since the through-connection hole 65 is deepened within a range of 1.5 to 10 times the depth of the connection hole 66, voids may be generated in the conductive material within the through-connection hole 65 even when the connection hole 66 is buried with a conductive material under the same opening size.

In the present embodiment, it is possible to form the hole with an optimal aspect ratio to bury the conductive material and prevent layout space from increasing by opening the through-connection hole 65 and the connection hole 66 having a different opening size depending on the depth. As a result, it is possible to prevent generation of voids when the through-connection hole 65 is deepened or when the conductive material is buried.

In the present embodiment, the connection hole 66 is connected to the copper interconnect 40 of the lowermost layer of the first wiring layer 41 in the upper portion of the first semiconductor substrate 31. Therefore, the space surrounding or directly underlying the connection hole 66 can be used as effective space through which an interconnect can pass. For this reason, it is advantageous to achieve miniaturization of the chip.

Furthermore, in the present embodiment, insulation between the interconnect 68 between the first and second semiconductor substrates and the first semiconductor substrate 31 is obtained by both the insulation layer 67 and the insulation spacer layer 42. However, insulation may be obtained by any one of the insulation layer 67 and the insulation spacer layer 42. In the case where the insulation spacer layer 42 is not formed, the area of the insulation spacer layer 42 is unnecessary. Therefore, it is possible to reduce the area of the pixel or increase the area of the photodiode (PD).

Figure 14:
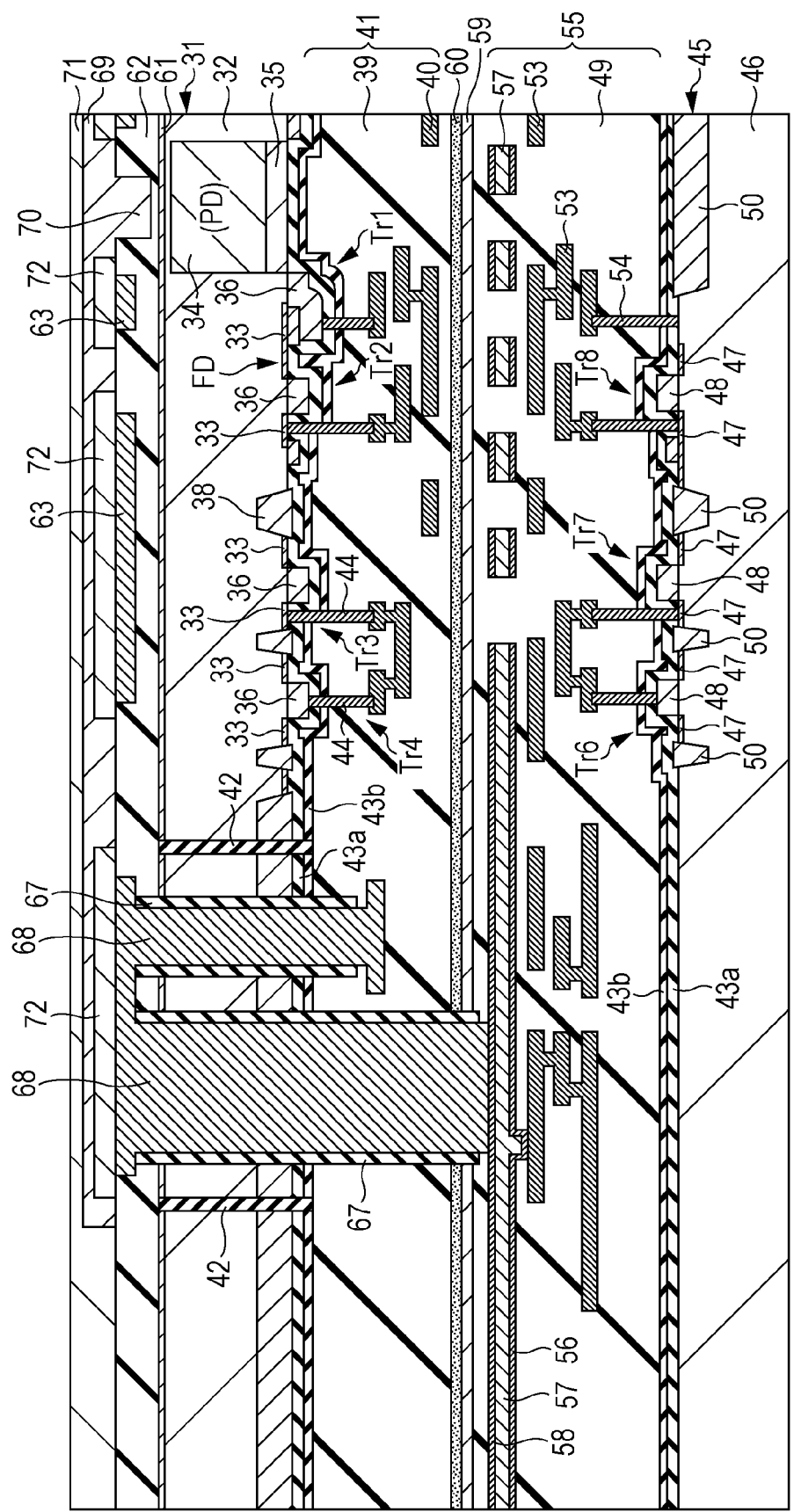
FIG. 14 is a manufacturing process diagram illustrating a method of manufacturing a solid-state imaging apparatus according to one embodiment of the present invention.

Next, as shown in FIG. 14, a cap film 72 is formed to cover upper portions of the interconnect 68 between the first and second semiconductor substrates and the light shielding film 63. The cap film 72 may be formed by depositing, for example, a SiN film or a SiCN film having a thickness of 10 to 150 nm. Then, an opening is formed in the insulation film 62 over the photodiode (PD), and the waveguide material film 69 is deposited in a desired area including such an opening. For example, SiN may be used in the waveguide material film 69, and the waveguide 70 is configured by the waveguide material film 69 formed in the opening. By forming the waveguide 70, the light incident from the rear surface side of the first semiconductor substrate 31 is effectively collected in the photodiode (PD). Then, the planarization film 71 is formed on the entire surface including the waveguide material film 69.

While the cap film 72 and the waveguide material film 69 thereon are separately formed using a different process in the present embodiment, the waveguide material film 69 may be also used in the cap film 72. In addition, while the waveguide 70 is formed in the light incident surface side of the photodiode (PD) in the present embodiment, no waveguide 70 may be formed.

Figure 15:
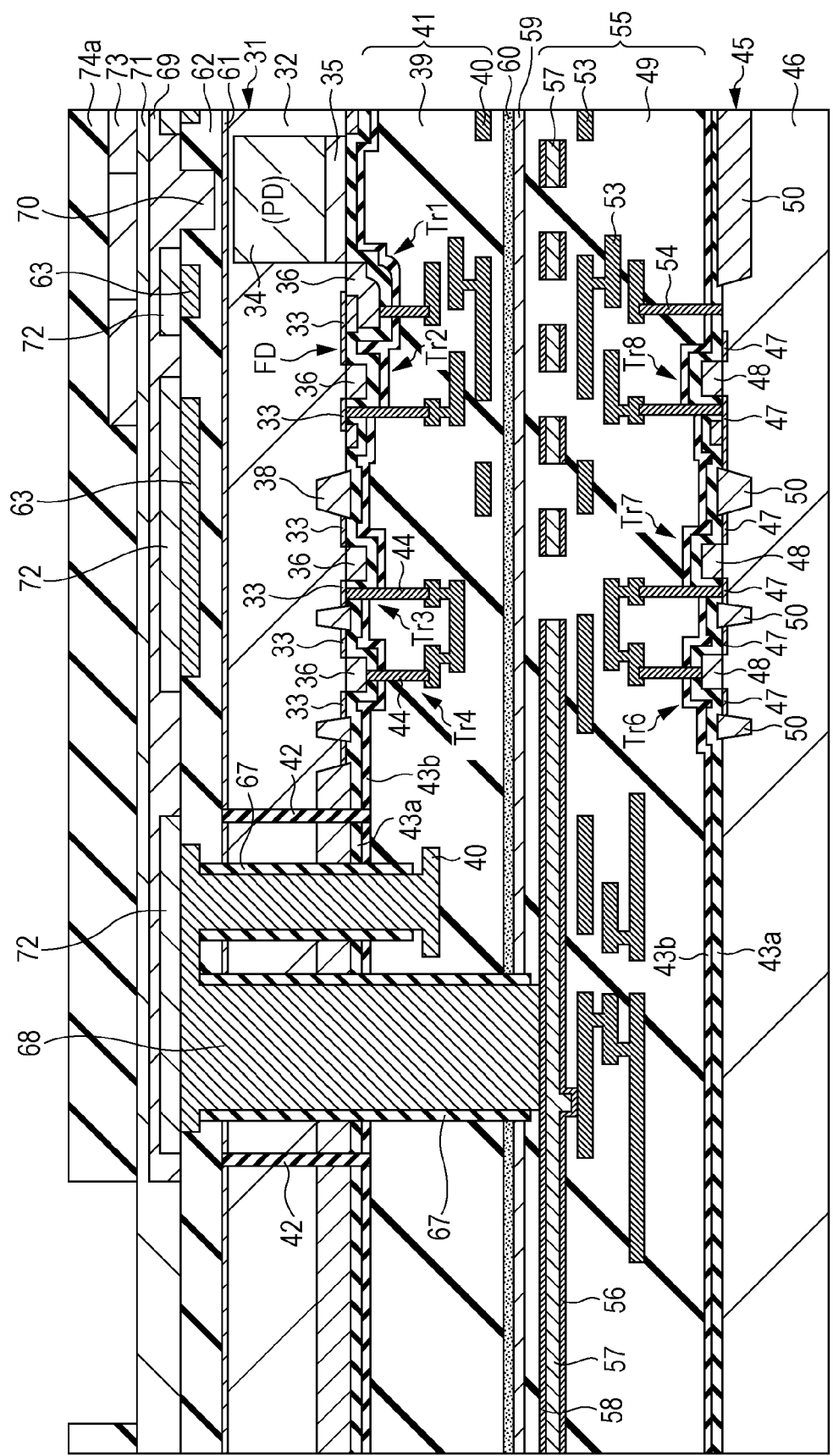
FIG. 15 is a manufacturing process diagram (illustrating a method of manufacturing a solid-state imaging apparatus according to one embodiment of the present invention.

Next, as shown in FIG. 15, for example, red (R), green (G), and blue (B) on-chip color filters 73 corresponding to each pixel of the planarization film 71 are formed. The on-chip color filter 73 may be formed over the photodiode (PD) included in a desired pixel array by depositing and patterning an organic film containing a pigment or a dye of a desired color. Then, the on-chip lens material 74a is deposited in the pixel array area including the upper portion of the on-chip color filter 73. For example, an organic film or an inorganic film such as SiO, SiN, and SiON can be used in the on-chip lens material 74a, which is deposited to have a thickness of 3000 to 4500 nm.

Figure 16:
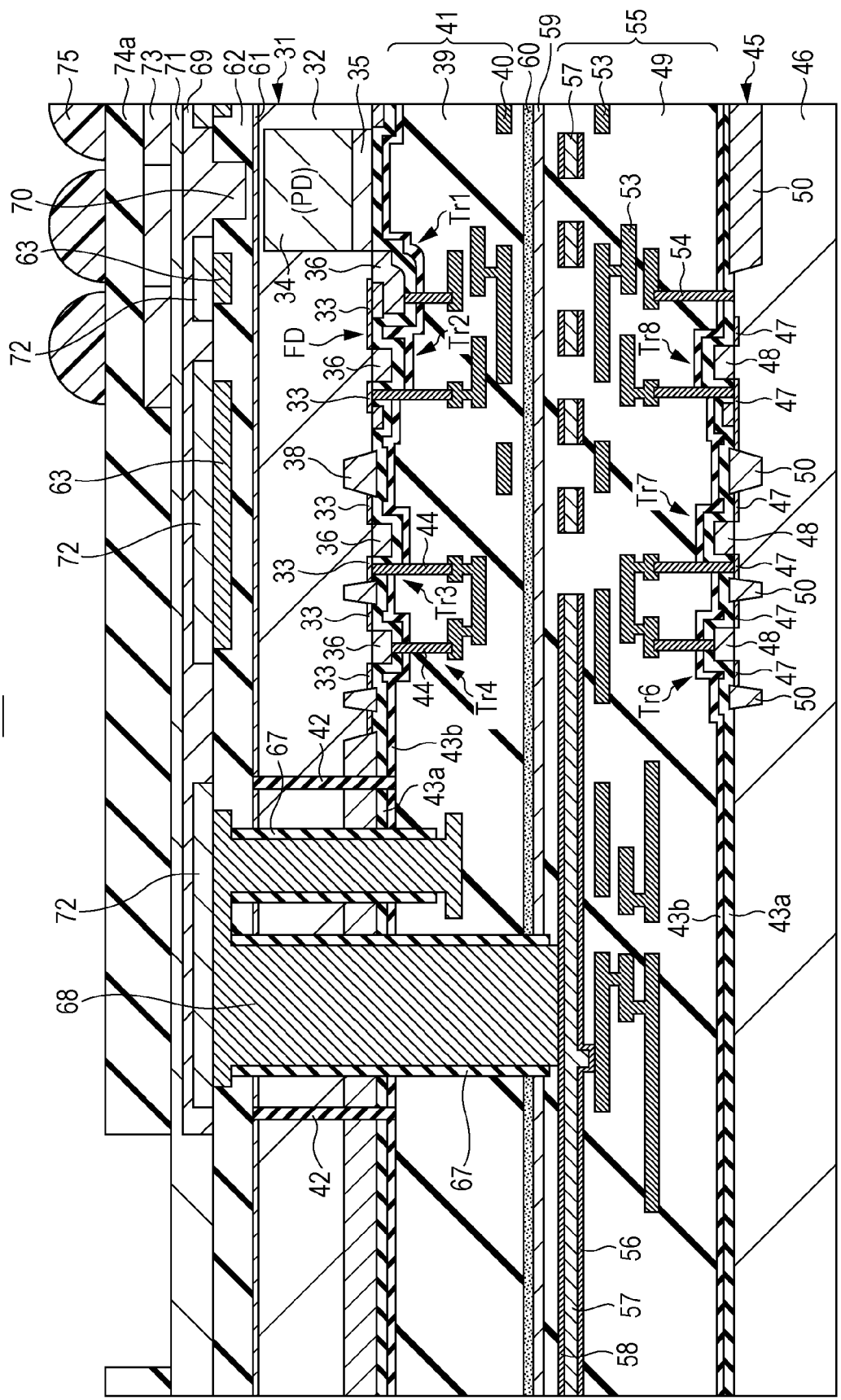
FIG. 16 is a manufacturing process diagram illustrating a method of manufacturing a solid-state imaging apparatus according to one embodiment of the present invention.
Figure 17:
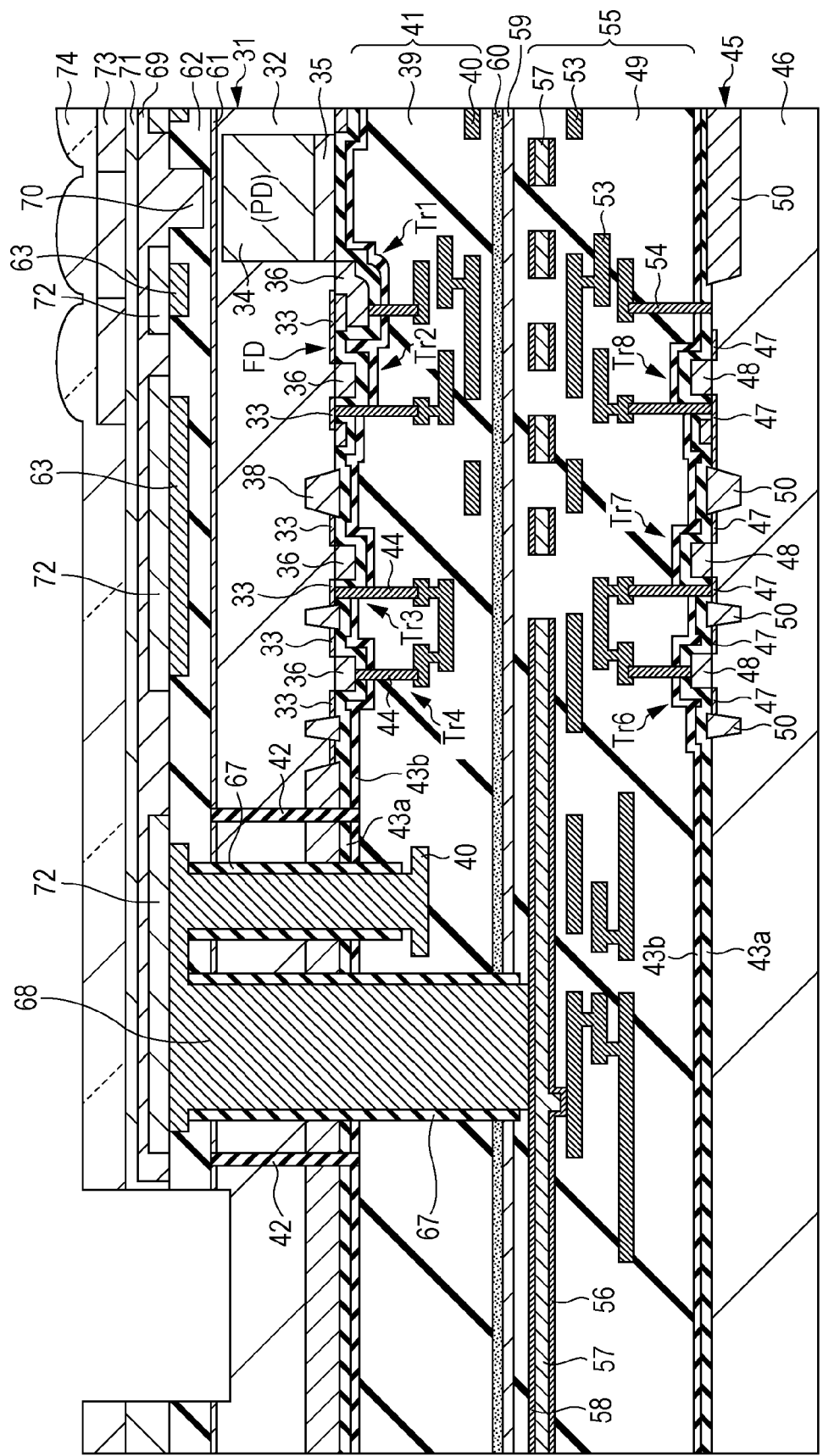
FIG. 17 is a manufacturing process diagram illustrating a method of manufacturing a solid-state imaging apparatus according to one embodiment of the present invention.

Next, as shown in FIG. 16, the resist film 75 for the on-chip lens is formed to have a thickness of, for example 300 to 1000 nm in the area corresponding to each pixel in the upper portion of the on-chip lens material 74a, and the etching process is performed. As a result, the shape of the resist film 75 for the on-chip lens is transferred to the on-chip lens material 74a, and the on-chip lens 74 is formed over each pixel as shown in FIG. 17. Then, the oxide film such as the insulation film 62 formed in the upper portion of the first semiconductor substrate 31 is etched using a $CF_4$ based gas (a flow rate of 10 to 200 sccm) to exposed the first semiconductor substrate 31.

Figure 18:
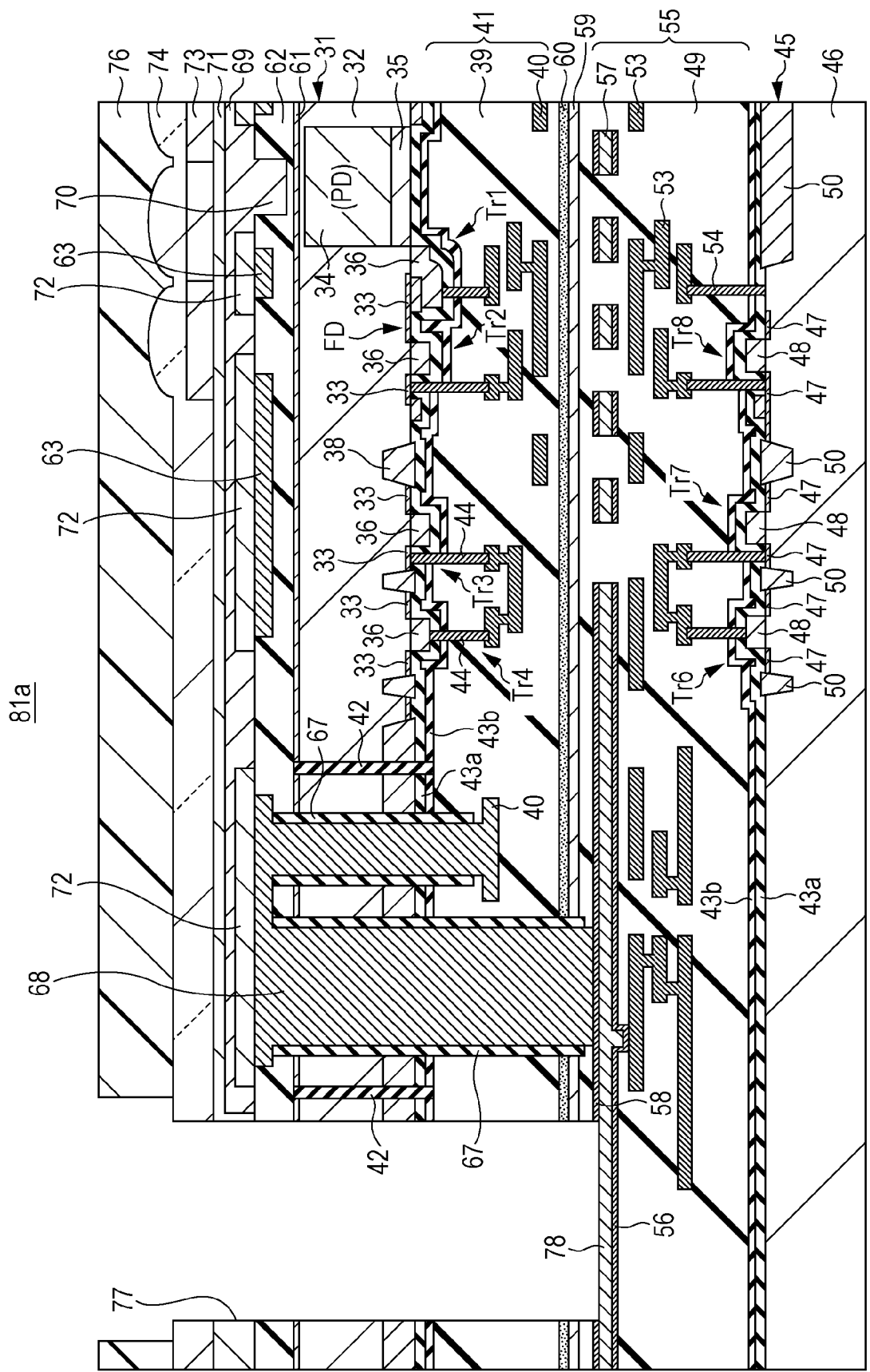
FIG. 18 is a manufacturing process diagram illustrating a method of manufacturing a solid-state imaging apparatus according to one embodiment of the present invention.

Next, as shown in FIG. 18, the resist film 76 formed to open the electrode pad portion 78 of FIG. 3 is formed on the on-chip lens 74. The resist film 76 is formed such that the end of the opening is disposed to be closer to the pixel side than the end of the on-chip lens 74 as shown in FIG. 18.

Figure 19:
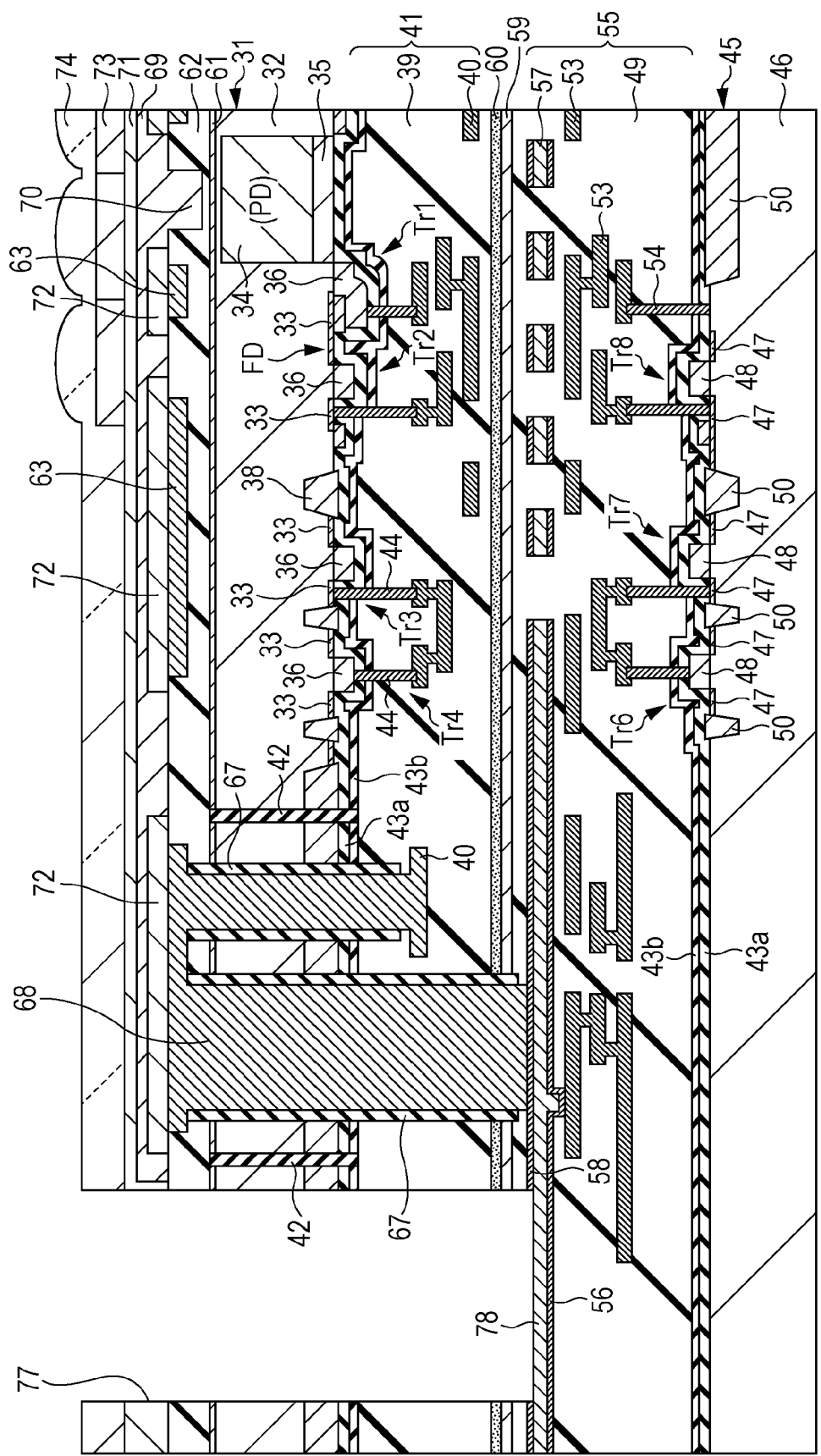
FIG. 19 is a manufacturing process diagram illustrating a method of manufacturing a solid-state imaging apparatus according to one embodiment of the present invention.

Next, etching is performed under a desired etching condition by using the resist film 76 as a mask. As a result, as shown in FIG. 19, etching is performed from the first semiconductor substrate 31 side, which is the uppermost substrate so as to form the via-hole opening portion 77 passing through the bonding surface between the first wiring layer 41 and the second wiring layer 55. In addition, the via-hole opening portion 77 is formed until the aluminum interconnect 57 formed in the second wiring layer 55 formed in the upper portion of the second semiconductor substrate 45, which is the lowermost substrate, is exposed. In this etching process, it is possible to etch out the first semiconductor substrate 31 by performing etching using, for example, $SF_6/O_2$ based gas (flow rate of 50 to 500 sccm ($SF_6$) or 10 to 300 sccm ($O_2$)) for 1 to 60 minutes. Then, it is possible to etch out the oxide film or the like until the aluminum interconnect 57 by performing etching using a $CF_4$ based gas (a flow rate of 10 to 150 sccm) for 1 to 100 minutes.

The aluminum interconnect 57 exposed in this manner becomes the electrode pad portion 78 used when connection to the external wire is performed. Hereinafter, the exposed aluminum interconnect 57 will be referred to as an electrode pad portion 78. It is preferable that a plurality of electrode pad portions 78 are formed in three or four sides of the exterior of the pixel area where each chip is formed.

In addition, as shown in FIG. 19, the stack structure 81a is formed by stacking two semiconductor substrates and then divided into each chip portion by performing a dicing process. As a result, as shown in FIG. 4, the solid-state imaging apparatus 81 including the first semiconductor chip portion 22 and the second semiconductor chip portion 26 is completed.

The solid-state imaging apparatus 81 formed in this manner may be connected to an external wire of the mounting board using a bonding wire 79 by connecting the bonding wire 79 to the electrode pad portion 78 as shown in FIG. 4. In addition, interconnects of the first wiring layer 41 and the second wiring layer 55 connected using the interconnect 68 between the first and second semiconductor substrates are electrically connected by electrically connecting the external wire to the electrode pad portion 78.

While the bonding wire 79 is connected to electrode pad portion 78 in the solid-state imaging apparatus 81 of the first embodiment, the external wire may be connected to the electrode pad portion 78 using a solder bump. Depending on a user's selection, the bonding wire or the solder bump may be used.

In addition, in the first embodiment, the solid-state imaging apparatus 81 of the semiconductor wafer is inspected using the electrode pad portion 78. In addition, the inspection includes two inspection stages including an inspection for the wafer state and an inspection for a final module state after cutting into chips.

In the solid-state imaging apparatus 81 and the method of manufacturing the same according to the first embodiment, the pixel area 23 and the control area 24 are formed in the chip portion of the first semiconductor substrate 31, and the logic circuit 25 for signal processing is formed in the chip portion of the second semiconductor substrate 45. Since the function of the pixel array and the logic function are provided in different chip portions in this manner, it is possible to use an optimal process formation technique for each of the pixel array and the logic circuit. Therefore, since each performance of the pixel array and the logic circuit can be sufficiently achieved, it is possible to provide a high performance solid-state imaging apparatus.

If the configuration of FIG. 2C is employed, the pixel area 23 which receives light may be formed only in the first semiconductor chip portion 22, and the control area 24 and the logic circuit 25 thereof may be separately formed in the second semiconductor chip portion 26. As a result, it is possible to independently select an optimal process technique in each functional chip and also reduce the area of the product module.

Since the pixel array and the logic circuit can be mixedly arranged using a wafer process technique of the related art, it is possible to ease the manufacturing process.

In addition, in the present embodiment, both the first semiconductor substrate 31 having the pixel area 23 and the control area 24 and the second semiconductor substrate 45 having the logic circuit 25 are bonded to each other in a semi-finished state so as to thin the first semiconductor substrate 31. That is, the second semiconductor substrate 45 is used as a support substrate when the first semiconductor substrate 31 is thinned. As a result, it is possible to save a material and reduce a manufacturing process. Furthermore, since the through-connection hole 65 and connection hole 66 are formed after the thinning, the aspect ratio of the hole is reduced, and it is possible to form the connection hole with high precision.

In addition, since the interconnect 68 between the first and second semiconductor substrates can be formed by burying a conductive material in the through-connection hole 65 and the connection hole 66 having a low aspect ratio, a metal material having bad coatability such as copper (Cu) as well as a metal material having excellent coatability such as tungsten (W) can be used. In other words, any conductive material can be used in the interconnect 68 between the first and second semiconductor substrates without limitation. As a result, it is possible to implement electric connection between the pixel are, the control circuit, and logic circuit with high precision. Therefore, it is possible to improve productibility, suppress manufacturing costs, and manufacture the high performance solid-state imaging apparatus.

Furthermore, in the present embodiment, the via-hole opening portion 77 formed for opening the electrode pad portion 78 is formed to pass through the bonding surface between the first wiring layer 41 and the second wiring layer 55, and the electrode pad portion 78 is structured in an interconnect of the second wiring layer 55 in a layer lower than the bonding surface. As a result, the electrode pad portion 78 is formed in a layer lower than the bonding surface, which is a weak surface, between the first wiring layer 41 and the second wiring layer 55. For this reason, it is possible to reduce a bonding stress applied to the bonding surface, which is a weak surface, for example, when the bonding wire 79 is pressedly attached to the electrode pad portion 78. As a result, it is possible to prevent cracks from being generated from the weak bonding surface during the wire bonding.

While a two-layer semiconductor wafer stack has been exemplified in the present embodiment, the present invention may be applied to a configuration having two or more multiple stacked layers. In this case, the via-hole opening portion is formed to expose the interconnect included in the interconnect layer of the lowermost semiconductor wafer, and the exposed interconnect is used as the interconnect pad portion. As a result, it is possible to reduce a stress generated in the weak bonding surface between the substrates when the external wire and the electrode pad portion are connected to each other.

In the rear-surface illuminated type solid-state imaging apparatus as in the present embodiment, it is necessary to arrange the photodiode functioning as a light receiving portion close to the circuit. Therefore, it is indispensable to thin the semiconductor layer as described above. The opening for exposing the interconnect in a layer lower than the bonding surface is preferably shallower. Therefore, similar to the present embodiment, in the case where the upper semiconductor substrate (in the present embodiment, the first semiconductor substrate) is a solid-state imaging element having a pixel array, it is preferable that the electrode pad portion is opened from the first semiconductor substrate having a thinned semiconductor layer.

In addition, while electrons are used as the signal charge, and the first conductivity type is the p-type, and the second conductivity type is the n-type in the solid-state imaging apparatus according to the aforementioned embodiments, the invention may be applied to the solid-state imaging apparatus that uses holes as the signal charge. In this case, the conductivity types of the semiconductor substrate, the semiconductor well area, and the semiconductor area are reversed so that the n-type is used as the first conductivity type, and the p-type is used as the second conductivity type.

While the MOS type solid-state imaging apparatus is exemplified in the first embodiment described above, the invention may be applied to a semiconductor apparatus. Next, a semiconductor apparatus having a structure in which different kinds of chips are stacked will be described as the second embodiment of the invention.

3. Second Embodiment

Figure 20:
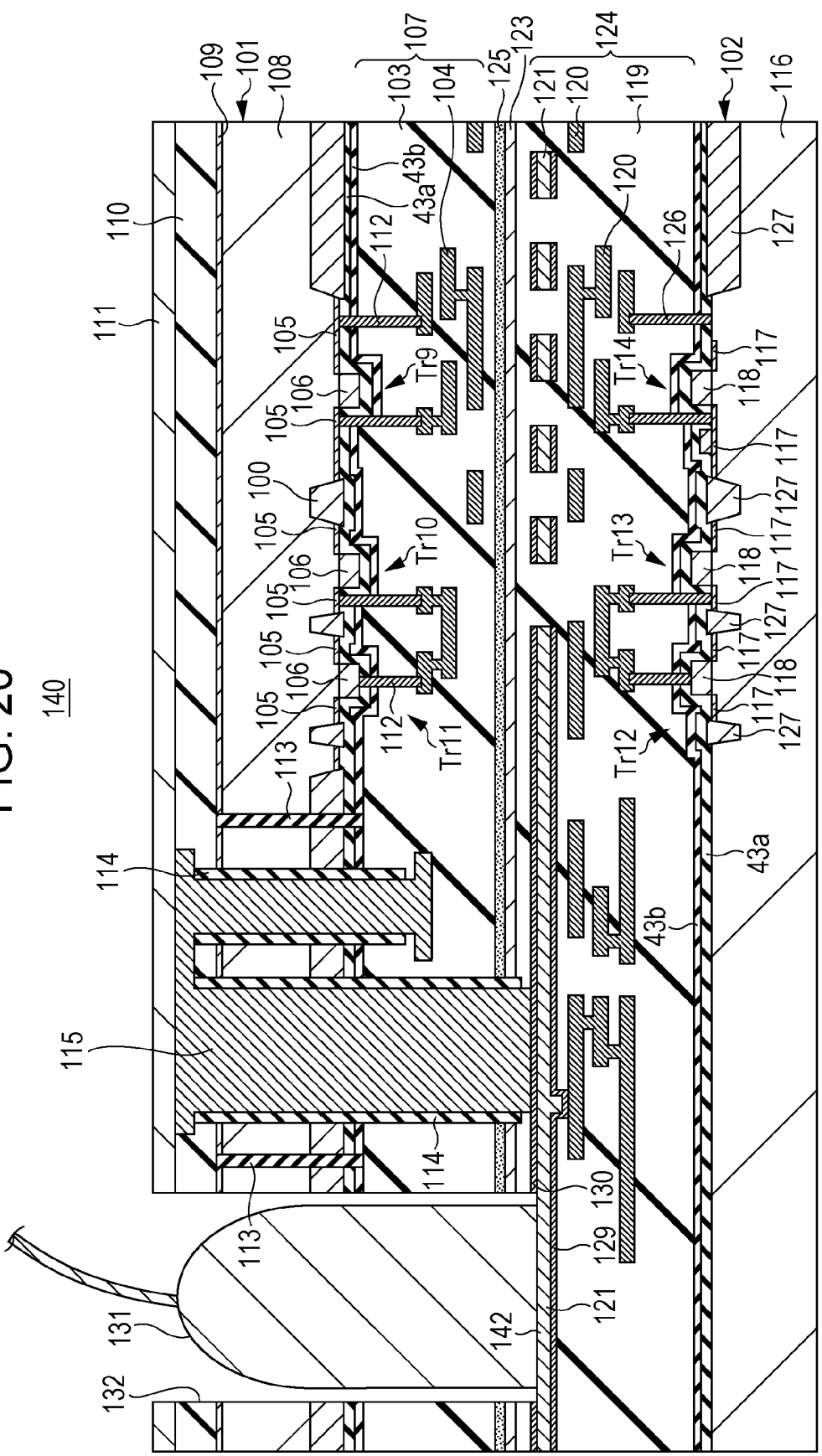
FIG. 20 is a schematic cross-sectional configuration diagram illustrating a solid-state imaging apparatus according to one embodiment of the present invention.

Configuration Example of Semiconductor Apparatus and Method of Manufacturing the Same A semiconductor apparatus and a method of manufacturing the same according to the second embodiment of the invention will be described with reference to FIGS. 20 to 26. The semiconductor apparatus 140 according to the present embodiment is obtained by stacking the first semiconductor substrate 101 having the first semiconductor integrated circuit and the second semiconductor substrate 102 having the second semiconductor integrated circuit. In FIG. 20, like reference numerals denote like elements as in FIG. 4, and descriptions thereof will not be repeated.

Figure 21:
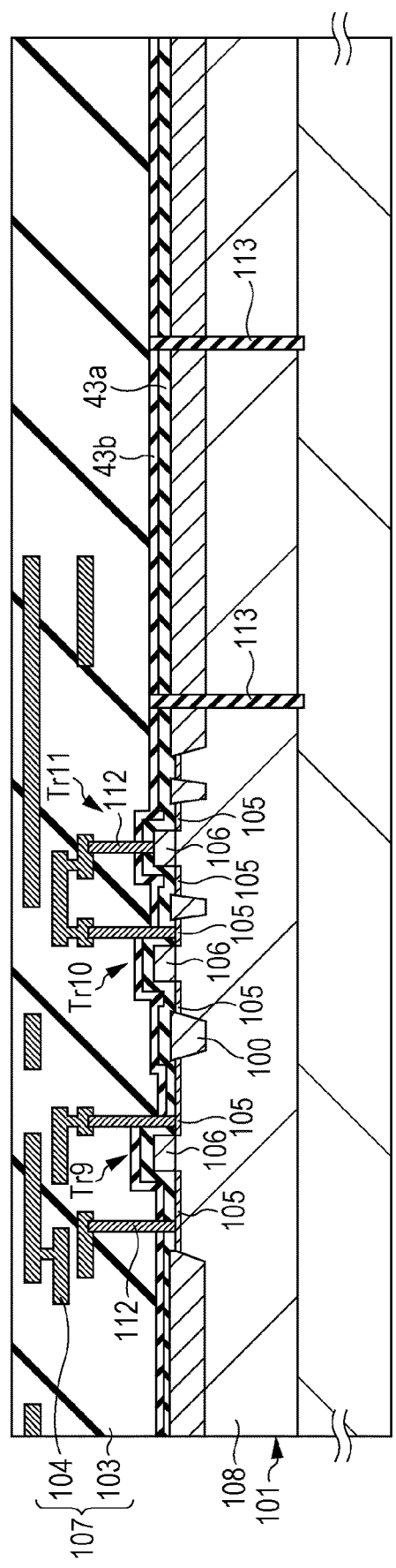
FIG. 21 is a manufacturing process diagram illustrating a method of manufacturing a semiconductor apparatus according to one embodiment of the present invention.

In the second embodiment, first, as shown in FIG. 21, a semi-finished first semiconductor integrated circuit, i.e., in this example, the logic circuit, is formed in the area corresponding to each chip portion of the first semiconductor substrate (semiconductor wafer) 101. Specifically, a plurality of MOS transistors Tr9, Tr10, and Tr11 are formed in the area corresponding to each chip portion of the semiconductor well area 108 formed in the first semiconductor substrate 101 made of a silicon substrate. Each MOS transistor Tr9 to Tr11 includes a source/drain pair area 105 and a gate electrode 106 formed by interposing a gate insulation film. Each MOS transistor Tr9 to Tr11 is separated by the element isolation area 100.

While a plurality of MOS transistors are formed, in FIG. 21, the MOS transistor Tr9 to Tr11 are representatively shown. The logic circuit may be made from a CMOS transistor. Therefore, a plurality of MOS transistors Tr9 to Tr11 may include an n-channel MOS transistor or a p-channel MOS transistor. Therefore, when the n-channel MOS transistor is formed, the n-type source/drain area is formed in the p-type semiconductor well area 108. When the p-channel MOS transistor is formed, the p-type source/drain area is formed in the n-type semiconductor well area.

As the first semiconductor integrated circuit, for example, a semiconductor memory circuit may be used instead of the logic circuit. In this case, the logic circuit corresponding to the second semiconductor integrated circuit described below is supplied to the signal processing of the semiconductor memory circuit.

In addition, after forming the second insulation thin-film 43b, similar to the first embodiment, an insulation spacer layer 113 for isolating a desired area within the semiconductor well area 108 of the first semiconductor substrate 101 is formed. The insulation spacer layer 113 is formed by opening a desired position of the first semiconductor substrate 101 from the rear surface side and burying an insulation material therein after forming the second insulation thin-film 43b. This insulation spacer layer 113 is formed in the area surrounding the interconnect 115 between the first and second semiconductor substrates of FIG. 20.

Next, the first wiring layer 107 including the three-layer copper interconnect 104 obtained by stacking a plurality of layers (in the example, three-layer) is formed on the first semiconductor substrate 101 by interposing the interlayer insulation film 103. While the interconnect of the first wiring layer 107 is made of copper in the present embodiment, the metal interconnect may be constructed using other metal materials. Such a first wiring layer 107 may be formed as in the first embodiment. In addition, each MOS transistor Tr9 to Tr11 is connected to the copper interconnect 104 of the necessary first layer through the connection conductor 112. In addition, each layer of the three-layered copper interconnect 104 is connected to each other by interposing the connection conductor 112.

Figure 22:
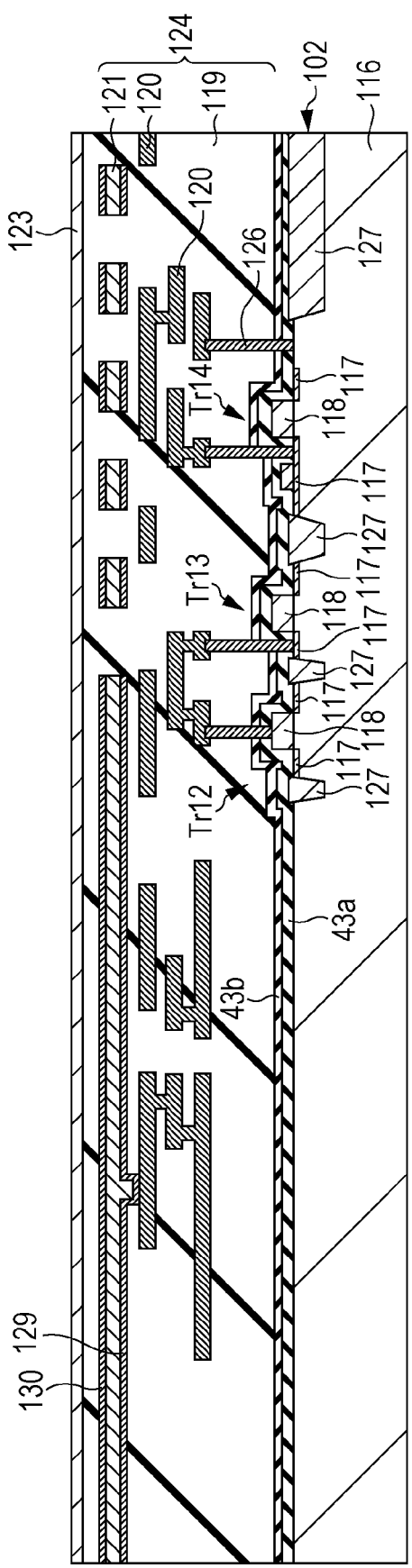
FIG. 22 is a manufacturing process diagram illustrating a method of manufacturing a semiconductor apparatus according to one embodiment of the present invention.

Meanwhile, as shown in FIG. 22, a semi-finished second semiconductor integrated circuit (e.g., in this example, logic circuit) is formed in the area corresponding to each chip portion of the second semiconductor substrate (semiconductor wafer) 102. That is, similar to FIG. 20, a plurality of MOS transistors Tr12, Tr13, and Tr14 are formed in the area corresponding to each chip portion of the semiconductor well area 116 formed in the second semiconductor substrate 102 made of silicon. Each MOS transistor Tr12 to Tr14 includes a source/drain pair area 117 and a gate electrode 118 formed by interposing the gate insulation film. In addition, the MOS transistors Tr12 to Tr14 are isolated by the element isolation area 127.

Figure 24:
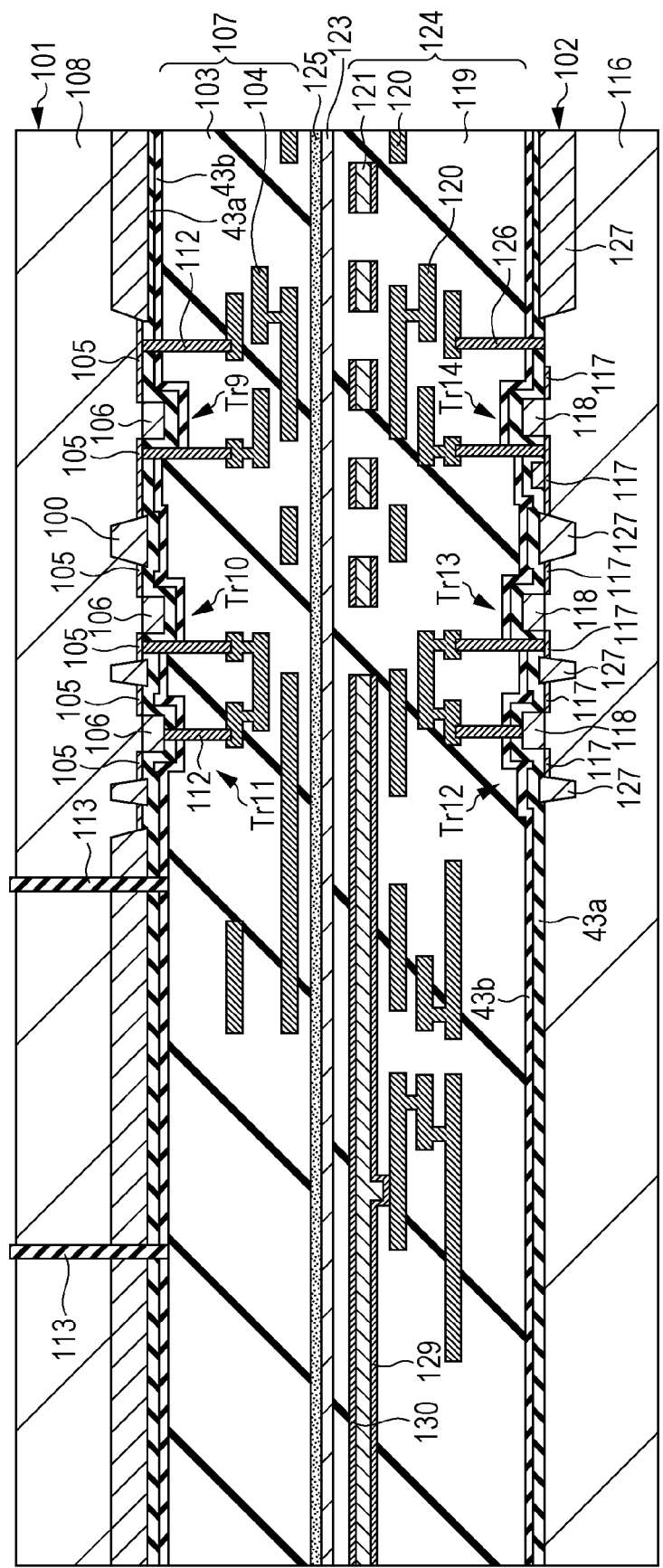
FIG. 24 is a manufacturing process diagram illustrating a method of manufacturing a semiconductor apparatus according to one embodiment of the present invention.

While a plurality of MOS transistors are formed, the MOS transistors Tr12 to Tr14 are representatively shown in FIG. 24. The logic circuit may be made from the CMOS transistor. For this reason, a plurality of MOS transistors may include an n-channel MOS transistor or a p-channel MOS transistor. Therefore, when the n-channel MOS transistor is formed, the n-type source/drain area is formed in the p-type semiconductor well area. When the p-channel MOS transistor is formed, the p-type source/drain area is formed in the n-type semiconductor well area.

Next, the second wiring layer 124 including the four-layered metal interconnect obtained by stacking a plurality of layer (in this example, four layers) is formed on the second semiconductor substrate 102 by interposing the interlayer insulation film 119. In the present embodiment, an example of forming a three-layered copper interconnect 120 and a single-layered aluminum interconnect 121 formed in the uppermost layer is provided. In addition, each MOS transistor Tr12 to Tr14 is connected to a necessary copper interconnect 120 of the first layer through the connection conductor 126. The copper interconnect 120 of the third layer and the aluminum interconnect 121 are connected to each other through the connection conductor 126. Furthermore, in the present embodiment, the barrier metal layers 129 and 130 are also deposited on and beneath the aluminum interconnect 121, and the aluminum interconnect 121 is connected to the copper interconnect 120 of a lower layer by interposing the underlying barrier metal layer 129. The second wiring layer 124 may be formed in a similar way to the wiring layer of the first embodiment.

In addition, a warping correction film 123 for alleviating a warping state generated when the first semiconductor substrate 101 and the second semiconductor substrate 102 are bonded is formed on the second wiring layer 124. The warping correction film 123 may be formed using a similar way to the first embodiment.

Figure 23:
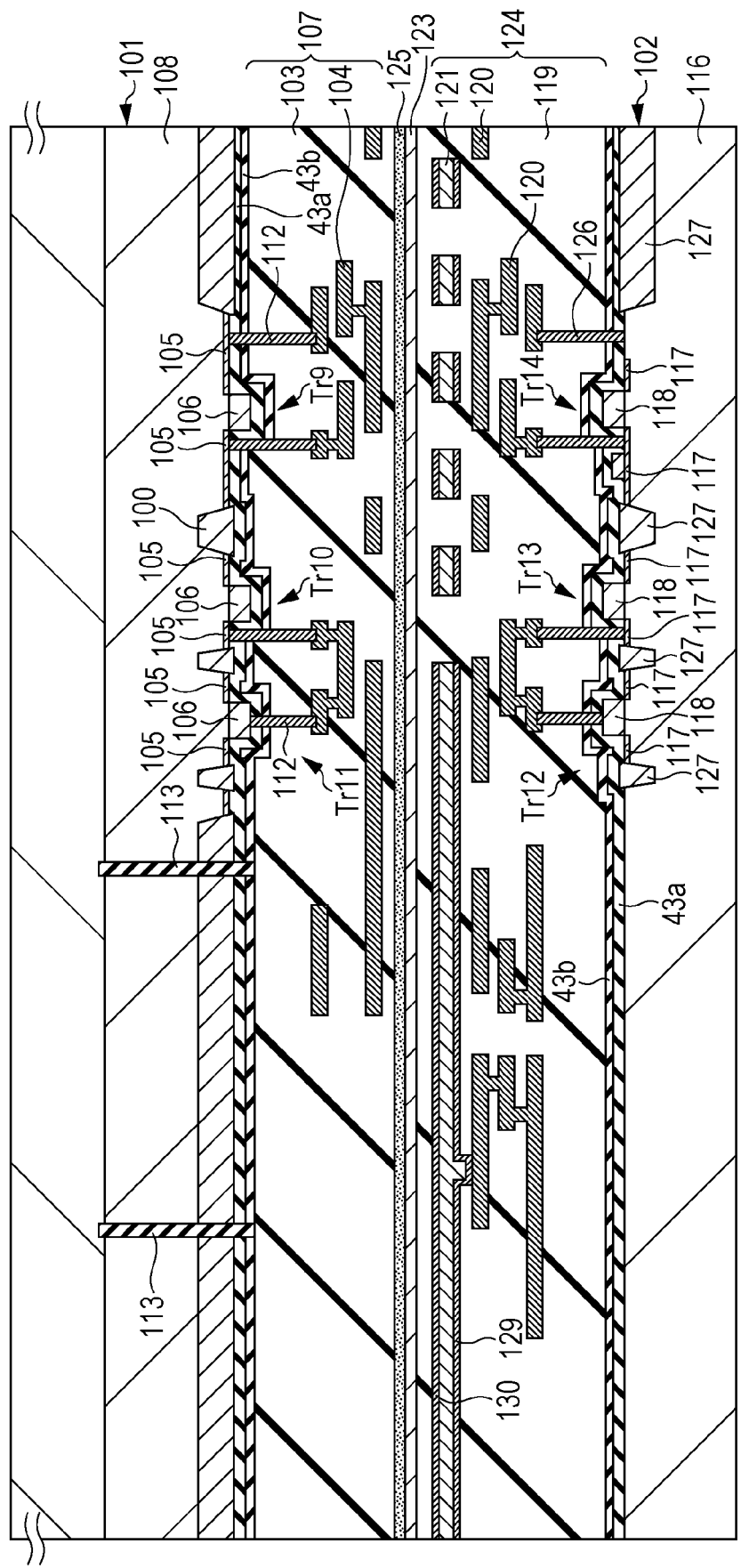
FIG. 23 is a manufacturing process diagram illustrating a method of manufacturing a semiconductor apparatus according to one embodiment of the present invention.

Next, as shown in FIG. 23, the first semiconductor substrate 101 and the second semiconductor substrate 102 are bonded, or secured, such that the first wiring layer 107 and the second wiring layer 124 face each other. The bonding is performed, for example, using an adhesive. When an adhesive is used in bonding, the adhesive layer 125 is formed on one of the bonding surfaces of the first semiconductor substrate 101 or the second semiconductor substrate 102, and they are overlapped and bonded with each other by interposing the adhesive layer 125. While the first semiconductor substrate 101 and the second semiconductor substrate 102 are bonded to each other by interposing the adhesive layer 125 in the present embodiment, additionally, they may be bonded using plasma bonding. In the case of plasma bonding, a plasma TEOS film, a plasma SiN film, a SiON film (block film), an SiC film, or the like is formed on each of the bonding surfaces of the first semiconductor substrate 101 and the second semiconductor substrate 102. The bonding surfaces formed on these films are plasma-processed and overlapped, and they are bonded to each other by annealing. The bonding process is preferably performed using a low-temperature process equal to or lower than 400° C. that does not influence the interconnect or the like. In addition, the first semiconductor substrate 101 and the second semiconductor substrate 102 are stacked and bonded so that a stack structure 140a including two different kinds of substrates is formed.

Next, as shown in FIG. 24, the first semiconductor substrate 101 of one side is thinned by performing grinding or polishing from the rear surface. Although the first semiconductor substrate 101 has a thickness of, for example, 600 µm, the thinning is performed up to a film thickness of, for example, approximately 5 to 10 µm.

Figure 25:
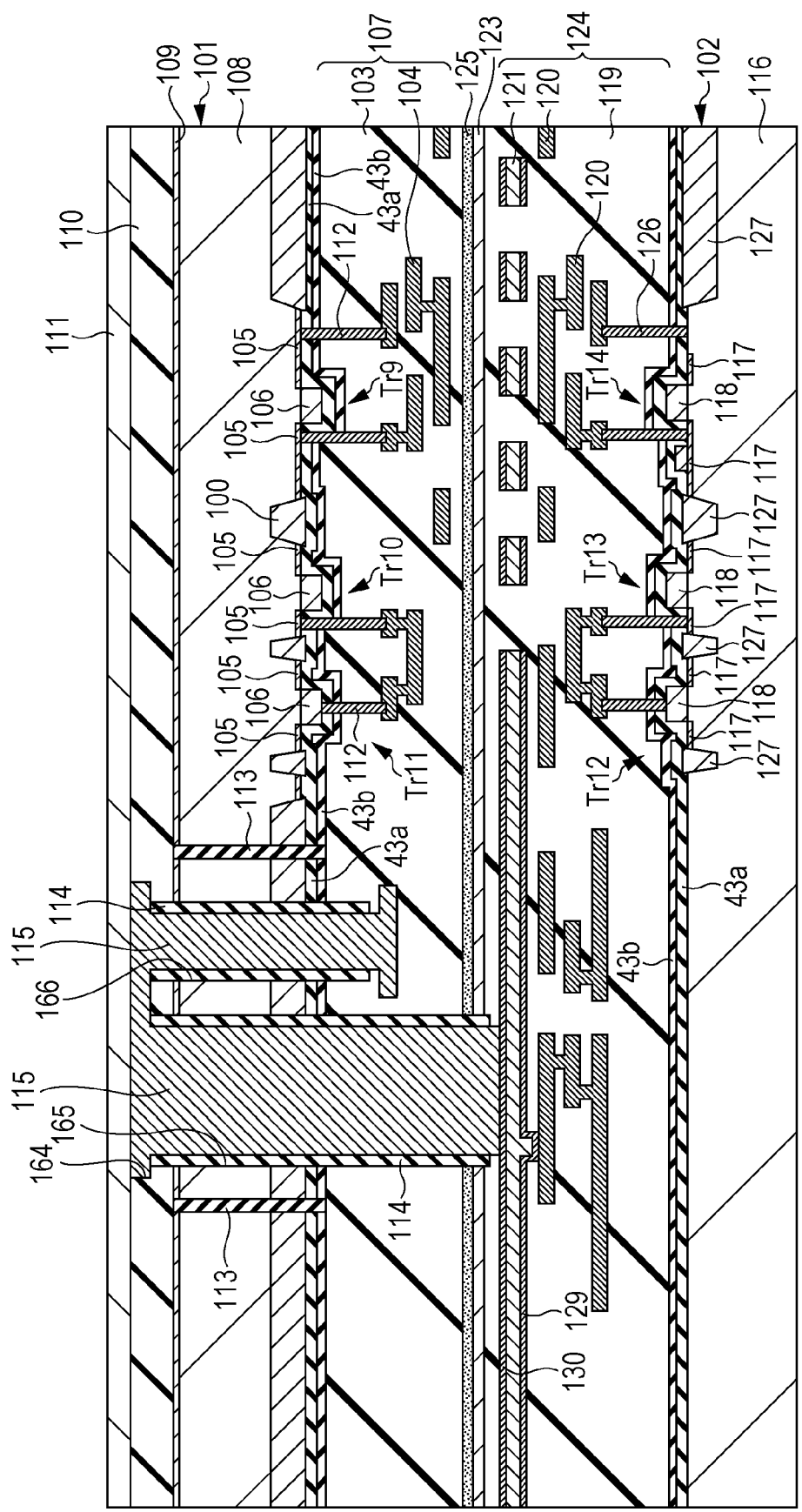
FIG. 25 is a manufacturing process diagram illustrating a method of manufacturing a semiconductor apparatus according to one embodiment of the present invention.

Next, as shown in FIG. 25, after the thinning, similar to the process of FIGS. 10 to 13 of the first embodiment, the trench portion 164, the through-connection hole 165, and the connection hole 166 are formed within the insulation spacer layer 113. Then, the interconnect 115 between the first and second semiconductor substrates is formed in the trench portion 164, the through-connection hole 165, and the connection hole 166 by interposing an insulation layer 114. Although not shown in the drawing, similar to the first embodiment, the light shielding film is formed in the light shielding area if necessary. In the present embodiment, since the through-connection hole 165 and the connection hole 166 are formed after thinning the first semiconductor substrate 101, it is possible to reduce an aspect ratio and form a fine hole. In the present embodiment, it is possible to form the hole with an optimal aspect ratio to bury the conductive material and prevent layout space from increasing by opening the through-connection hole 165 and the connection hole 166 having a different opening size depending on the depth. As a result, it is possible to prevent generation of voids even in a deep through-connection hole 165 when the conductive material is buried.

In addition, the circuit formed in the first semiconductor substrate 101 and the circuit formed in the second semiconductor substrate 102 are electrically connected through the interconnect 115 between the first and second semiconductor substrates. Then, similar to the first embodiment, the cap film 72 is formed on the entire surface including the upper portion of the interconnect 115 between the first and second semiconductor substrates.

Figure 26:
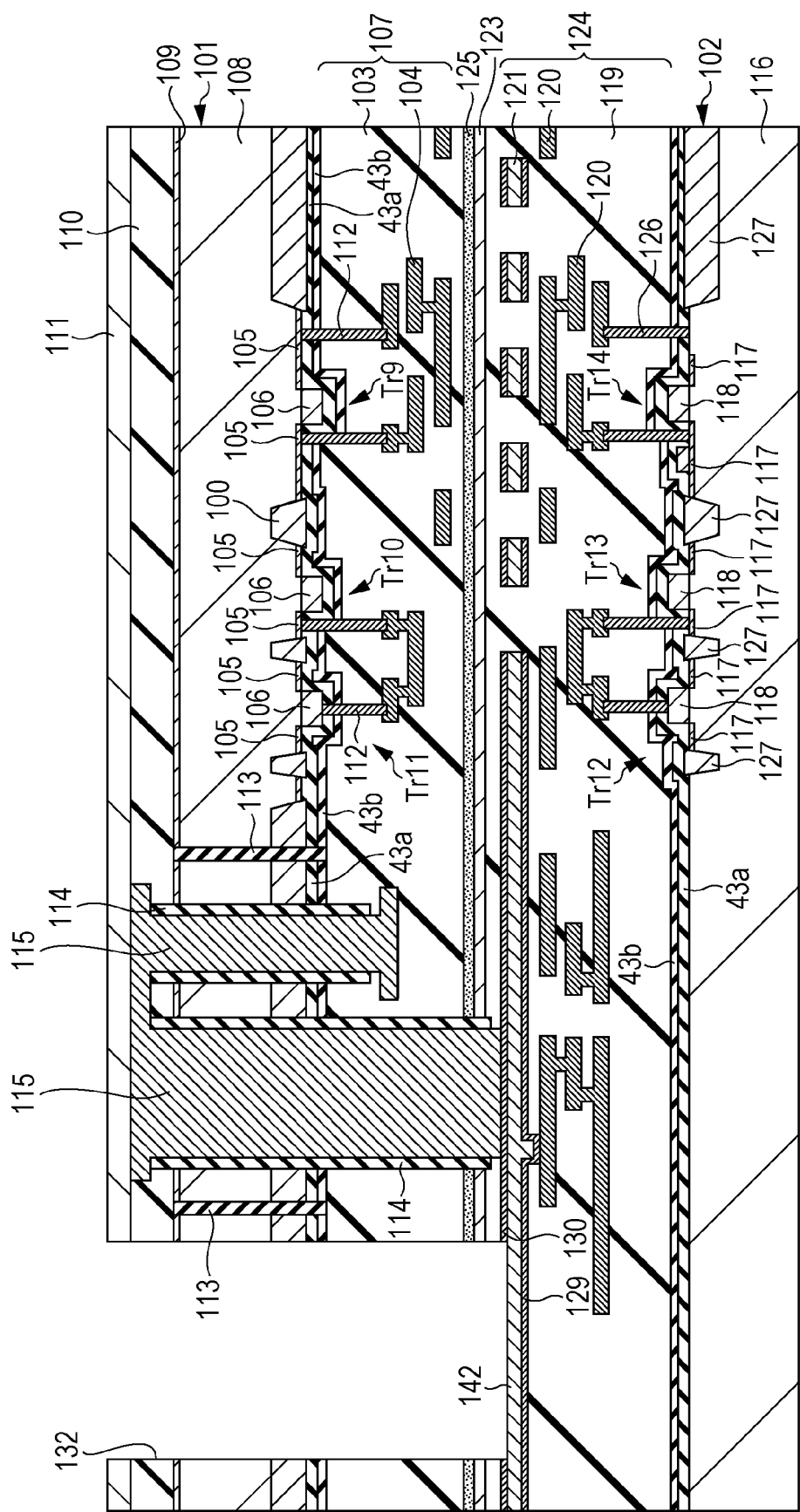
FIG. 26 is a manufacturing process diagram illustrating a method of manufacturing a semiconductor apparatus according to one embodiment of the present invention.

Next, a via-hole opening portion 132 passing through the first semiconductor substrate 101 is formed to expose the aluminum interconnect 121 by performing etching using the mask (not shown) having an opening in a desired area as shown in FIG. 26. As a result, electrode pad portion 142 is formed from the exposed aluminum interconnect 121. Subsequently, the semiconductor apparatus 140 of the present embodiment shown in FIG. 20 is completed by performing dicing to dividing into each chip portion.

Each of the divided chips may be connected to an external wire of the mounting board using a bonding wire 131 by connecting the bonding wire 131 to the electrode pad portion 142 as shown in FIG. 20. In addition, interconnects (circuits) formed in the first semiconductor substrate 101 and the second semiconductor substrate 102 connected using the interconnect 115 between the first and second semiconductor substrates are electrically connected to each other by electrically connecting the external wire to the electrode pad portion 142.

In the semiconductor apparatus 140 and the method of manufacturing the same according to the second embodiment, it is possible to form the first semiconductor integrated circuit and the second semiconductor integrated circuit in different chip portions using an optimal process technique and provide a high performance semiconductor integrated circuit as described above. In addition, it is possible to reduce manufacturing costs by bonding the first and second semiconductor wafers in a semi-finished state and thinning them, and by making a chip in a completely-finished state after electrically connecting the first and second semiconductor integrated circuits.

In addition, effects similar to the first embodiment can be obtained.

In the first and second embodiments described above, the interconnect between the upper and lower semiconductor wafers is used as only the interconnect for electrically connecting the first semiconductor integrated circuit formed in the first semiconductor substrate and the second semiconductor integrated circuit formed in the second semiconductor substrate. However, the present invention is not limited thereto. For example, by using the interconnect between the upper and lower semiconductor wafers, it is possible to commonly use a part of the interconnect having the same electric potential (for example, power interconnect or ground interconnect) separately provided in the first semiconductor substrate and the second semiconductor substrate.

Hereinafter, an example of forming the interconnect between the upper and lower semiconductor wafers as the power interconnect and the ground interconnect commonly used between the first semiconductor substrate and the second semiconductor substrate.

4. Third Embodiment

Figure 27:
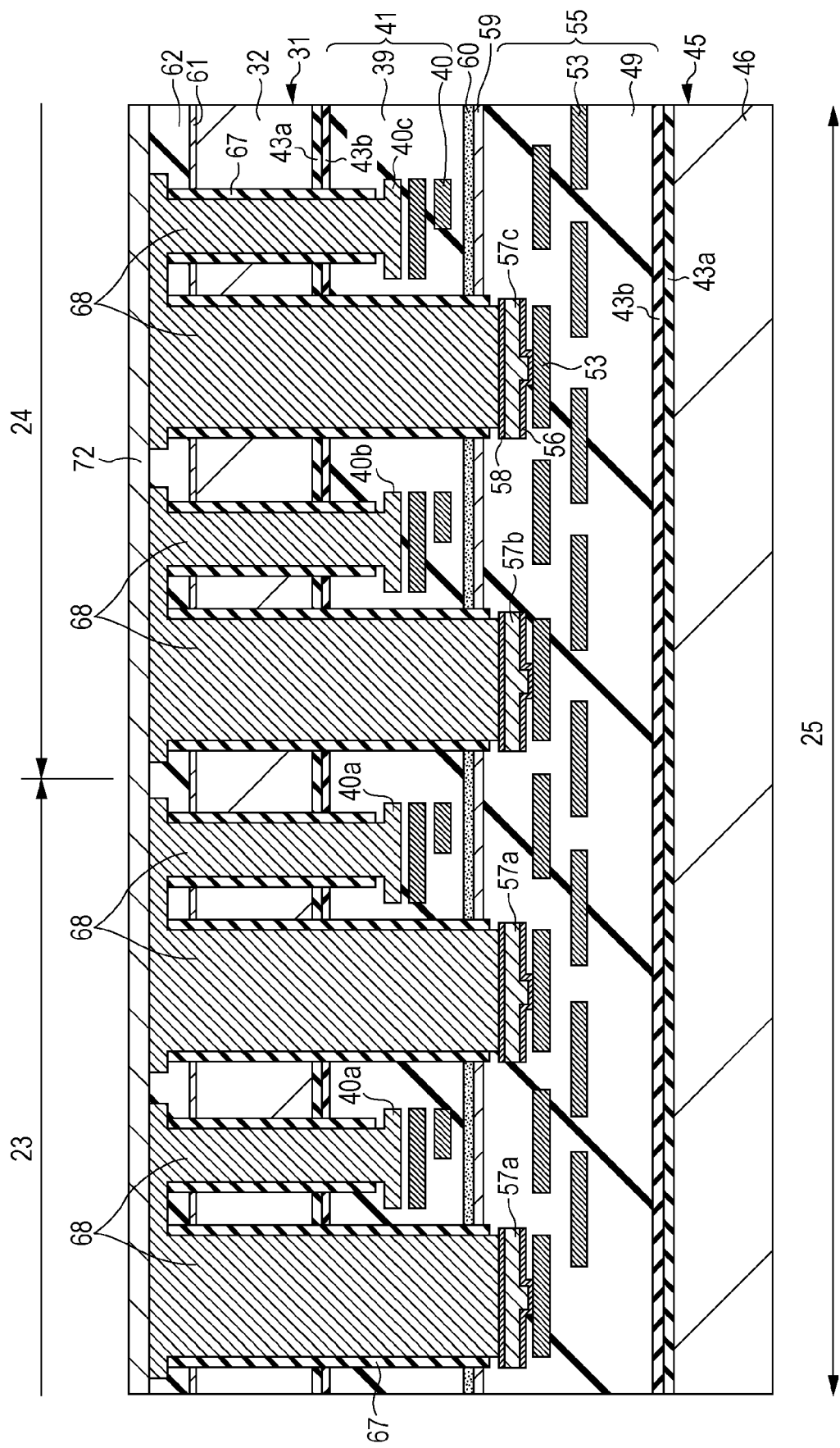
FIG. 27 is a schematic cross-sectional configuration diagram illustrating main parts of the solid-state imaging apparatus according to one embodiment of the present invention.

FIG. 27 is a schematic configuration diagram illustrating the solid-state imaging apparatus according to the third embodiment of the invention. In FIG. 27, like reference numerals denote like elements as in FIG. 4, and descriptions thereof will be omitted.

FIG. 27 illustrates an area including the pixel area 23 and the control area 24 of the solid-state imaging apparatus. For the purpose of simplification, some transistors and photodiodes are omitted.

As shown in FIG. 27, in the pixel area 23, the copper interconnect 40a which outputs a pixel signal formed in the first semiconductor substrate 31 is connected to the signal interconnect 57a formed in the interconnect of the uppermost layer of the second wiring layer 55 through the interconnect 68 between the first and second semiconductor substrates. In this case, in the circuit configuration shown in FIG. 3, the interconnect between the first and second semiconductor substrates is formed between the interconnect connected to the drain of the selection transistor formed in the first semiconductor substrate 31 and the signal interconnect. In addition, the processes in the stage subsequent to the signal interconnect 57a are performed in the logic circuit 25 included in the second semiconductor substrate 45.

In the present embodiment, the power interconnect 57b and the ground interconnect 57c formed in the uppermost layer of the second wiring layer 55 and the copper interconnects 40b and 40c formed in the uppermost interconnect of the first wiring layer 41 are connected through the interconnect 68 between the first and second semiconductor substrates. As a result, the power interconnect 57b and the ground interconnect 57c are shared between the first semiconductor substrate 31 and the second semiconductor substrate 45.

In the 3-dimensional device in which two semiconductor substrates are bonded and connected through the interconnect between the first and second semiconductor substrates, in order to reduce the height difference on the bonding surface of the substrate, it is difficult to form a thick interconnect layer (corresponding to the first wiring layer 41 and the second wiring layer 55 in FIG. 27). Therefore, in the 3-dimensional device of the related art, since a distance between interconnects is small, it is difficult to reduce the resistance between interconnects. In addition, if the power interconnect or the ground interconnect is separately formed between the two semiconductor substrates, an unallowable high resistance is added, the element size increases, and noise may be caused by the power voltage drop.

In the solid-state imaging apparatus of the present embodiment, it is possible to provide an interconnect having an effectively low resistance by sharing the power interconnect 57b or the ground interconnect 57c through the interconnect 68 between the first semiconductor substrate 31 and the second semiconductor substrate 45 vertically stacked. In addition, it is possible to traverse elements or interconnects having a different electric potential by forming a rear-surface interconnect connected to the interconnect 68 between the first and second semiconductor substrates on the rear surface side of the thinned first semiconductor substrate 31.

Hereinafter, an interconnect layout and a design method thereof in the stack chip obtained by stacking a first semiconductor chip (hereinafter, referred to as an upper chip) and a second semiconductor chip (hereinafter, referred to as a lower chip).

FIG. 28A is a schematic configuration diagram illustrating a stack chip 90 in which a part of the power supply circuit 92 having the power interconnect 57b is formed in the rear-surface interconnect 99 in the solid-state imaging apparatus according to the present embodiment. FIG. 28B is a schematic configuration diagram illustrating a stack chip 91 in which the entire power supply circuit 92 having the power interconnect 57b is formed in the second wiring layer 55 as a comparative example.

As shown in FIG. 28A, the power interconnect is shared between chips through the interconnect 68 between the first semiconductor substrate 31 and the second semiconductor substrate 45. The terminal connected to the power interconnect of the power supply circuit 92 is connected to the mounting board through the power interconnect 57b of the uppermost layer of the second wiring layer 55. In addition, a part of the power supply circuit 92 formed in the first wiring layer 41 is terminated at the position that can minimize overlapping on the layout and is included in the rear-surface interconnect 99 through the interconnect 68 between the first and second semiconductor substrates. In other words, in the configuration in FIG. 28B shown as a comparative example, a part of the power supply circuit 92 (the area a surrounded by the dashed line) is included in the rear-surface interconnect 99 formed in the rear surface side of the first semiconductor substrate 31. In this case, the rear-surface interconnect 99 may be formed using a damascene method as in the connection interconnect 68a formed on the interconnect 68 between the first and second substrates.

In this manner, in the example of FIG. 28A, a part of the power supply circuit 92 is moved to the rear surface side of the first semiconductor substrate 31 and included in the rear-surface interconnect 99. As a result, the interconnect can be vertically stacked. Therefore, it is possible reduce the size of the power supply circuit 92 in comparison with the configuration of FIG. 28B.

FIG. 29A is a block diagram illustrating connection from the power interconnect of the stack chip 90 to the power terminal and connection from the ground interconnect to the ground terminal. FIG. 29B is a block diagram illustrating connection from the power interconnect to the power terminal and connection from the ground interconnect to the ground terminal in the circuit portion of the stack chip 91 according to the comparative example.

FIGS. 29A and 29B are schematic configuration diagram illustrating main components as the stack chips 90 and 91 obtained by stacking upper and lower chips are seen from the surface, and schematically illustrate the circuit portion 96 formed in the upper chip and the circuit portion 97 formed in the lower chip.

In the comparative example, as shown in FIG. 29B, the power interconnect 40b and the ground interconnect 40c of the circuit portion 96 of the upper chip and the power interconnect 57b and the ground interconnect 57c of the circuit portion 97 of the lower chip are separately connected to each of the power terminal 95 and the ground terminal 94. In this case, it is necessary to pull the power interconnects 40b and 57b and the ground interconnects 40c and 57c in both the upper and lower chips.

In this manner, in the design of the stack chip, in order to independently operate the upper and lower chips, it is necessary to terminate the wiring to the input/output terminal such as the power interconnect or the ground interconnect and the protection circuit (not shown) of the input/output portion within each chip. However, in the stack chip 91 shown in FIG. 29B, if the interconnect sharing an electric potential such as the power interconnect or the ground interconnect or the protection circuit (not shown) is overlappingly arranged between both chips, the layout efficiency is degraded, and the chip cost increases.

In the configuration of the present embodiment, as shown in FIG. 29A, the power interconnects 40b and 57b and the ground interconnects 40c and 57c within the upper and lower chips are connected through the rear-surface interconnect 99 or the interconnect between the upper and lower chips formed in the connection hole 66 and the through-connection hole 65. In addition, connection to the ground terminal 94 and the power terminal 95 is obtained using the power interconnect 57b and the ground interconnect 57c of the lower chip. Therefore, in the upper chip, after the power interconnect 40b and the ground interconnect 40c are connected to the interconnect 68 between the first and second substrates, it is not necessary to pull the interconnect. As a result, in comparison with the example of FIG. 29B, since extra space can be formed in the area z surrounded by the dashed line shown in FIG. 29A, an additional circuit can be formed in the extra space. As a result, it is possible to realize an optimal arrangement that uses the chip area to the maximum.

While a part of the circuit is included in the rear-surface interconnect 99 formed in the rear surface side of the first semiconductor substrate 31 in the present embodiment, the circuit commonly used between two chips may be formed in the substrate having larger extra space in the site area of the interconnect. As a result, it is possible to mutually suppress the number of interconnect layers and the layout area of the wiring layer.

However, basically, in the case where the interconnect having the same electric potential such as the power interconnect or the ground interconnect is formed on the same substrate, it is possible to readily suppress the layout area by sharing the area between neighboring circuits. However, in the configuration that the two-layer chip is included in different substrates, since the wiring route of the circuit is limited by the interconnect between the first and second substrates, it is not easy to share the interconnect having the common electric potential.

Hereinafter, a design method for realizing a design of the solid-state imaging apparatus according to the present embodiment will be described.

Figure 30:
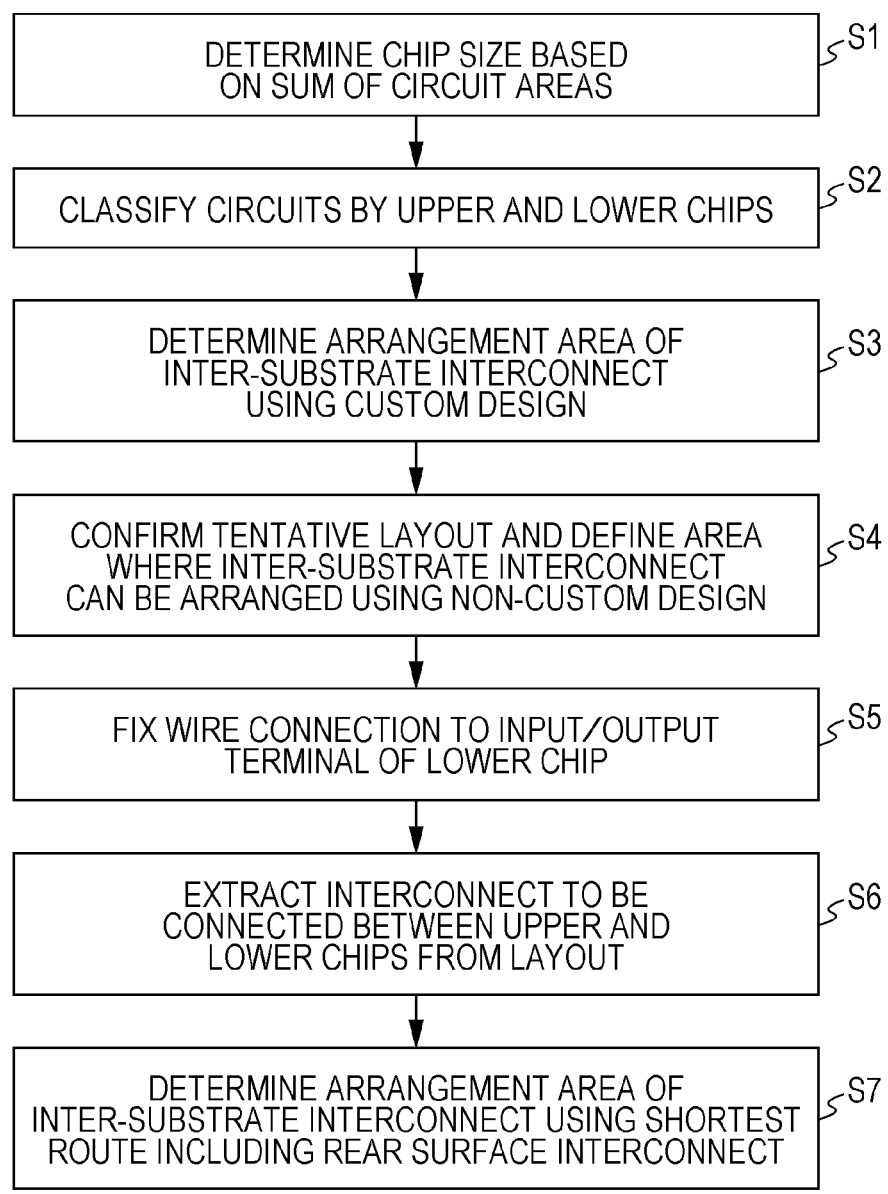
FIG. 30 depicts a flowchart illustrating a method of designing solid-state imaging apparatus according to one embodiment of the present invention.

FIG. 30 illustrates a method of designing a solid-state imaging apparatus according to the present embodiment, and FIGS. 31A to 34B are manufacturing process diagrams of the upper chip (FIGS. 31A, 32A, 33A, and 34A) and the lower chip (FIGS. 31B, 32B, 33B, and 34B) according to the design process thereof.

In the solid-state imaging apparatus according to the present embodiment, in order to connect a stack of the upper chip 22 and the lower chip 26 using the interconnect, it is important to arrange the interconnect 68 between the upper and the lower chips 22 and 26 at the position not interfering with the circuit or the interconnect.

Figure 31A:
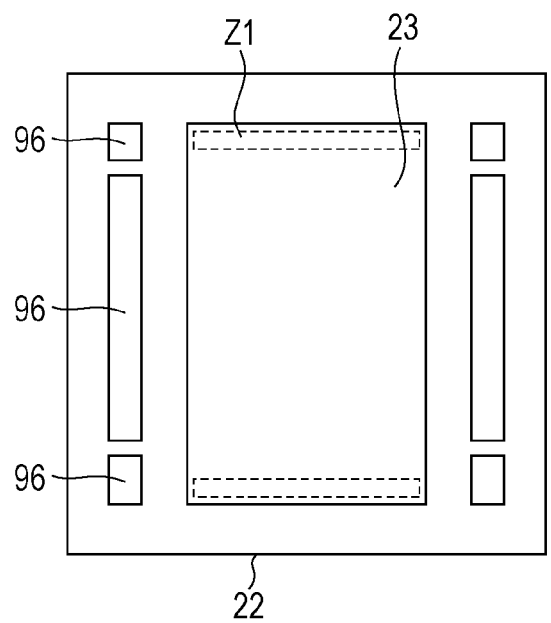
FIGS. 31A and 31B depict a manufacturing process for upper and lower chips according to one embodiment of the present invention.
Figure 31B:
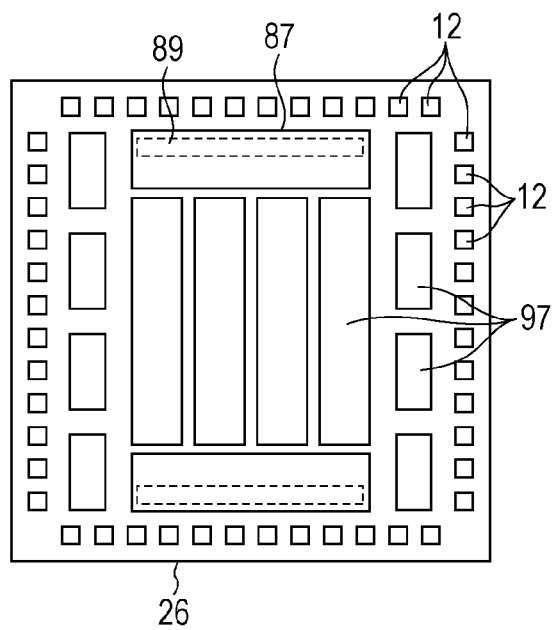

First, a chip size is determined based on a total circuit area (step S1). Subsequently, circuits to be included in the upper and lower chips 22 and 26 are classified (step S2). In the present embodiment, as shown in FIGS. 31A and 31B, the pixel area 23 and the control circuit 96 are formed in the upper chip 22, and the logic circuit 97 and the input/output terminal 12 are formed in the lower chip 26.

Figure 32A:
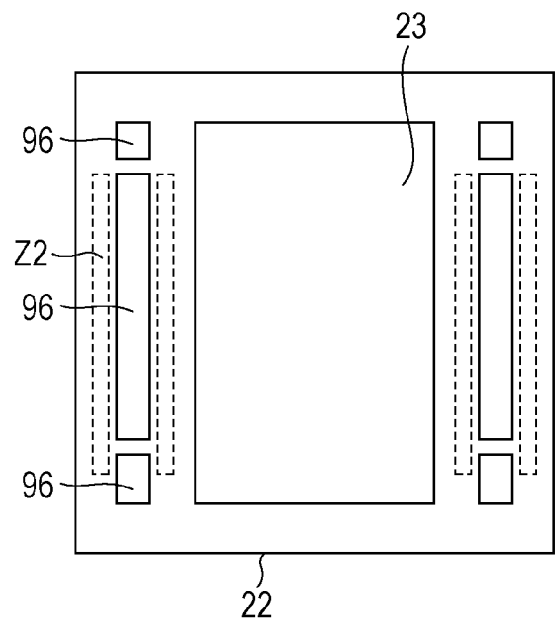
FIGS. 32A and 32B depict a manufacturing process for upper and lower chips according to one embodiment of the present invention.
Figure 32B:
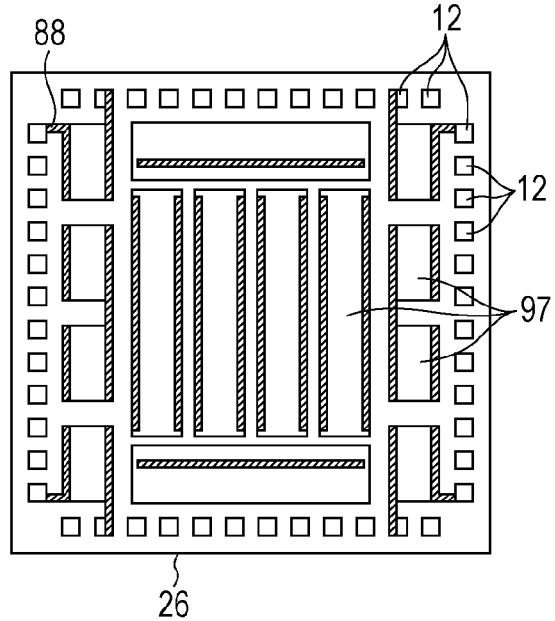

Next, the layout of the interconnect between the first and second substrates is determined. The layout of the interconnect between the upper and the lower chips 22 and 26 is determined at the position designed using a custom design (designed based on an instruction of a customer) such as a position allowing a lot of signal lines to be directly connected between the upper and lower chips 22 and 26 (in the solid-state imaging apparatus, the connection position between the pixel and the signal interconnect) (step S2). As a result, the arrangement area of the interconnect between the upper and the lower chips 22 and 26 using a custom design is determined in the area represented by the area z1 of FIGS. 32A and 32B. As shown in FIGS. 32A and 32B, the circuit surface directly connected (i.e., the position of the interconnect between the upper and the lower chips 22 and 26 in a custom design) is necessary to be disposed in the same position as that of the upper and lower chips 22 and 26. Therefore, if determination is made in this way, the broad arrangement of the circuit is limited.

Next, the exterior sizes of the circuit components mounted in the upper and lower chips 22 and 26 are virtually defined, and a virtual layout is confirmed, so that the vacant area where not circuit is arranged is confirmed. As a result, the area (the area z2 in FIG. 32A), where the interconnect between the upper and the lower chips 22 and 26 can be arranged, other than the area determined using a custom design is confirmed (step S4). In the lower chip 26, if an interconnect receiving the interconnect between the upper and the lower chips 22 and 26 can be arranged, a circuit may be arranged directly under that interconnect. However, in the case where the interconnect between the upper and the lower chips 22 and 26 is arranged, it is difficult to arrange a circuit directly under and around the upper chip 22. Therefore, the area where the interconnect between the upper and the lower chips 22 and 26 is arranged is mainly limited by the circuit arrangement of the upper chip 22.

Next, the interconnect route (interconnect 88 of FIG. 32B) of the input/output terminal 12 and the connection wires of each circuit in the lower chip 26 are obtained using automatic wiring similar to a normal circuit design (step S5). As a result, as shown in FIG. 32B, the input/output terminal 12 and the logic circuit 97 are connected through the interconnect 88 in the lower chip 26.

Figure 33A:
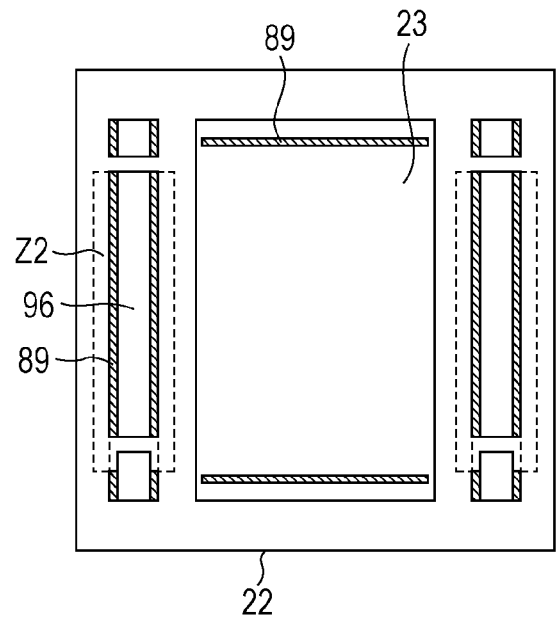
FIGS. 33A and 33B depict a manufacturing process for upper and lower chips according to one embodiment of the present invention.
Figure 33B:
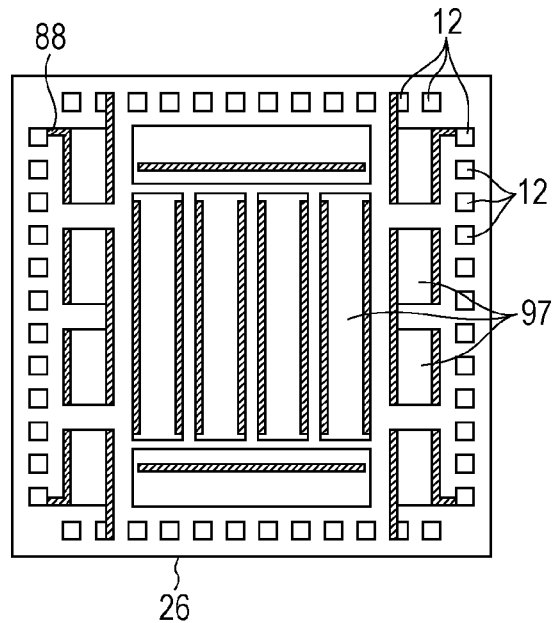
Figure 34A:
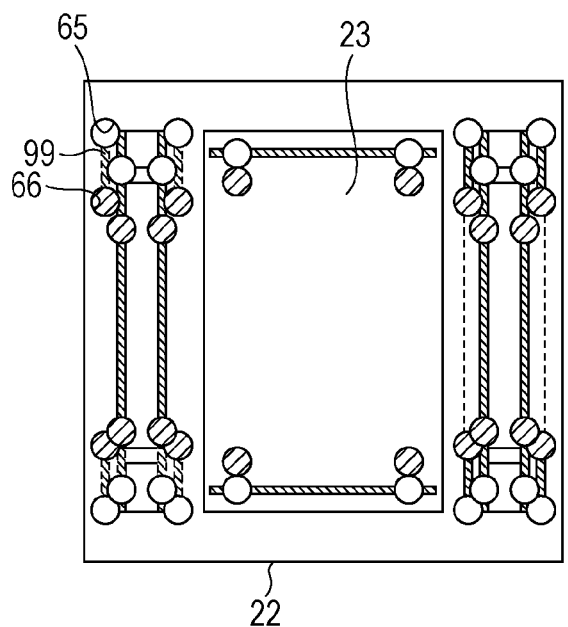
FIGS. 34A and 34B depicts a manufacturing process for upper and lower chips in a designing method according to an embodiment of the invention.
Figure 34B:
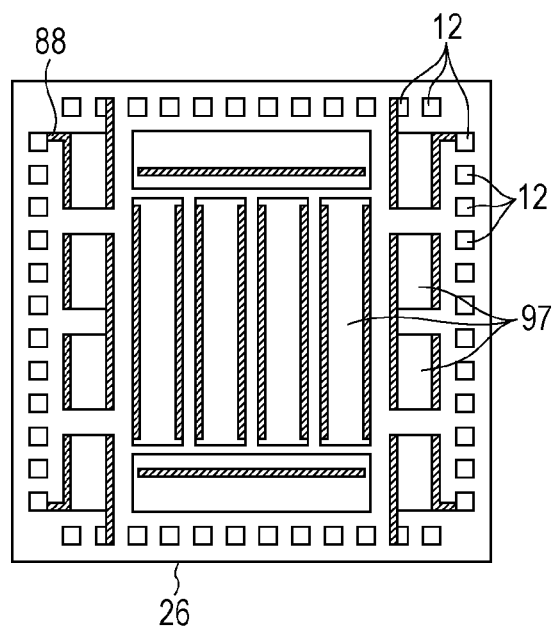

Next, the interconnect having the same electric potential to be connected between the upper and lower chips 22 and 26 is extracted (step S6). As a result, as shown in FIG. 33A, the layout of the interconnect 89 of the upper chip 22 to be connected to the interconnect 88 of the lower chip 26 is obtained. Next, as shown in FIGS. 34A and 34B, in the area, where the interconnect between the upper and the lower chips 22 and 26 can be arranged, determined in the step S4, the arrangement positions of the through-connection hole 65 and the connection hole 66 are determined at the position where a distance between the interconnect 89 of the upper chip 22 and the interconnect 88 of the lower chip 26 is shortest including the rear-surface interconnect through the automatic wiring. As a result, the arrangement position of the interconnect between the upper and the lower chips 22 and 26 is determined (step S7). That is, in this case, the wiring route of the rear-surface interconnect 99 is also determined. As a result, desired electrodes of the lower and upper chips 22 and 26 are connected to each other with the interconnect between the upper and the lower chips 22 and 26, and the interconnect between the upper and the lower chips 22 and 26 connected to the lower chip 26 and the interconnect between the upper and the lower chips 22 and 26 connected to the upper chip 22 are connected to each other with the rear-surface interconnect 99.

The solid-state imaging apparatus designed and manufactured in this manner is completed by performing connection verification, physical verification, timing verification, or the like as in a typical processing flow.

As described above, in the solid-state image apparatus of the present embodiment, in order to form the interconnect between the upper and the lower chips and passing through the stacked chips, it is necessary to form the interconnect between the upper and the lower chips at the position not interfering with a circuit or an interconnect. Therefore, it is necessary to add a process that does not exist in a design process of the related art.

In the method of designing the solid-state imaging apparatus according to the present embodiment, it is possible to connect the interconnects having the same electric potential using the interconnect between the upper and lower chips 22 and 26 and simplify the circuit formed in the chip using the rear-surface interconnect. As a result, it is possible to effectively use the chip area and reduce the chip size.

While an example of the solid-state imaging apparatus has been described in the present embodiment, a design method of the present embodiment may be applied to the manufacturing of the semiconductor apparatus of the second embodiment.

In design of the semiconductor apparatus of the stack chip of the related art, circuits can be divided for each functional block, and each circuit can be distributed to upper and lower chips. Meanwhile, in the semiconductor apparatus of the present invention, it is possible to sufficiently reduce the pitches of the connection hole and the through-connection hole (for example, up to 1 μm). Therefore, it is possible to move a part of the functional blocks to another substrate without increasing the arrangement area of the interconnect between the upper and the lower chips. As a result, it is possible to move a part of the circuits from the substrate having an insufficient interconnect arrangement area to the substrate having a larger extra area or commonly use a part of the circuit. Therefore, it is possible to perform an optimal layout having a small extra area as a whole.

5. Fourth Embodiment

Configuration Example of Electronic Apparatus

The aforementioned solid-state imaging apparatus of the present embodiment may be applied to electronic apparatuses including a camera system such as a digital camera or a video camera, a mobile phone having an imaging function, other devices having an image function, or the like.

Figure 35:
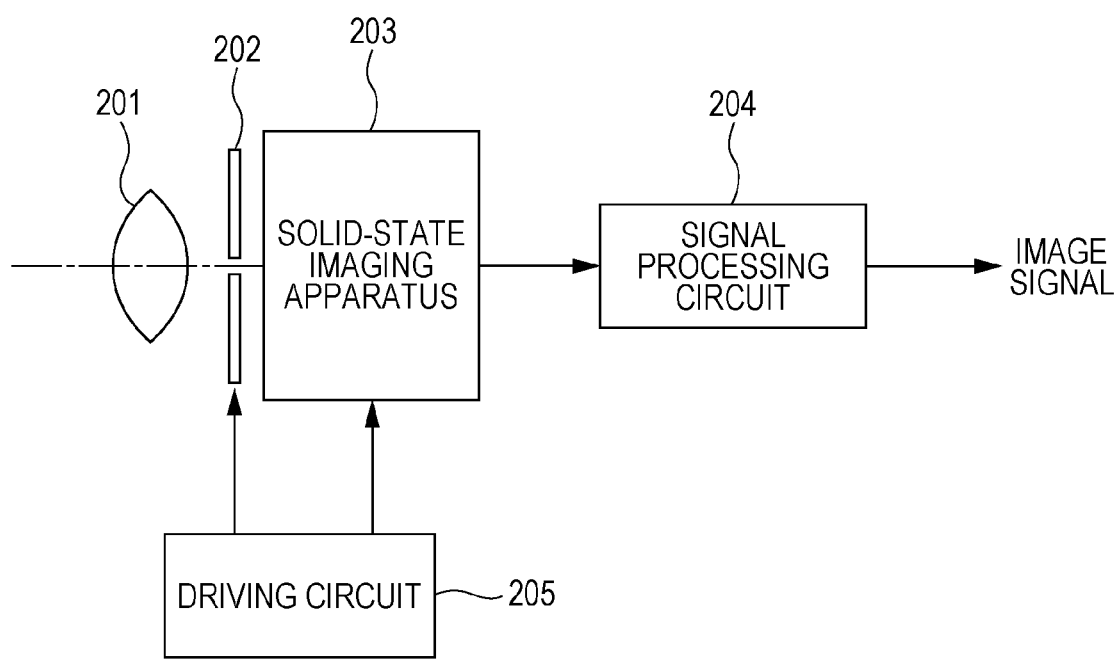
FIG. 35 depicts an electronic apparatus according to the one embodiment of the present invention.

FIG. 35 is a schematic configuration diagram illustrating an electronic apparatus according to the fourth embodiment of the invention. In FIG. 35, a camera 200 is exemplified as an electronic apparatus according to the present invention. As the camera 200 according to the present embodiment, a video camera capable of taking a still image or a moving picture is exemplified. The camera 200 of the present embodiment includes a solid-state imaging apparatus 203, an optical system 201 for guiding incident light to the photoelectric conversion portion having photodiodes of the solid-state imaging apparatus 203, and a shutter device 202. Furthermore, the camera 200 includes a driving circuit 205 for driving the solid-state imaging apparatus 203 and a signal processing circuit 204 for processing the output signal of the solid-state imaging apparatus 203.

In the solid-state imaging apparatus 203, the aforementioned solid-state imaging apparatus according to the first embodiment is applied. The optical system (optical lens) 201 focuses the image light (incident light) from the subject on the imaging area of the solid-state imaging apparatus 203. As a result, signal charges are accumulated in the solid-state imaging apparatus 203 for a predetermined time period. The optical system 201 may be an optical lens system including a plurality of optical lenses. The shutter device 202 controls an illumination time period and a light blocking time period to the solid-state imaging apparatus 203. The driving circuit 205 supplies a driving signal for controlling a transmission operation of the solid-state imaging apparatus 203 and a shutter operation of the shutter device 202. Based on the driving signal (timing signal) supplied from the driving circuit 205, the signal transmission of the solid-state imaging apparatus 203 is performed. The signal processing circuit 204 performs various kinds of signal processing. The image signal subjected to the signal processing is stored in a storage medium such as memory or output to a monitor.

In the electronic apparatus such as a camera 200 according to the fourth embodiment, it is possible to achieve high performance in the solid-state imaging apparatus 203 and reduce manufacturing costs. Therefore, in the present embodiment, it is possible to inexpensively provide an electronic apparatus having high reliability.

As can be seen in all of the above described embodiments, along any cross section parallel to the interface between the two chips or substrates, the cross sectional area of the deeper interconnect is larger than that of the short interconnect. If the cross sectional areas are circular, then the cross section of the deeper interconnect is larger than that of the shorter interconnect. It should be understood by those skilled in the art that various modifications, combinations, sub-combinations and alterations may occur depending on design requirements and other factors insofar as they are within the scope of the appended claims or the equivalents thereof.

What is claimed:

1. A semiconductor device, comprising:
a first material layer adjacent to a second material layer;
a first via passing through the first material layer and extending into the second material layer; and
a second via extending into the first material layer, wherein,
along a common cross section parallel to an interface between the two material layers, the first via has a cross section larger than that of the second via.

2. The semiconductor device of claim 1, including:
a first insulating layer in the first material layer;
a second insulating layer in the second material layer, wherein,
the first via extends into the second insulating layer in the second material layer, and the second via extends into the first insulating layer in the first material layer.

3. The semiconductor device of claim 1, wherein the first via and the second via are filled with a conductive material.

4. The semiconductor device of claim 2, wherein the first via reaches a second interconnect in the second insulating layer in the second material layer.

5. The semiconductor device of claim 2, wherein the second via reaches a first interconnect in the first insulating layer in the first material layer.

6. The semiconductor device of claim 1, including an on chip lens over a photodiode of the first material layer.

7. The semiconductor device of claim 6, including an on chip color filter between the photodiode and the on chip lens.

8. The semiconductor device of claim 1, wherein the first via has a diameter 1.5 to 10 times a diameter of the second via along the common cross section parallel to the interface between the two material layers.

9. The semiconductor device of claim 1, wherein the first via has a diameter 3 to 4 times a diameter of the second via along the common cross section parallel to the interface between the two material layers.

10. The semiconductor device of claim 1, wherein the device is a backside illuminated device.

11. The semiconductor device of claim 1, wherein the first material layer is a semiconductor layer.

12. The semiconductor device of claim 1, wherein the second material layer is a semiconductor layer.

13. The semiconductor device of claim 1, wherein the first material layer and the second material layer are separate layers.

* * * * *